(12) United States Patent
Edmundson et al.

(10) Patent No.: US 11,412,609 B2
(45) Date of Patent: Aug. 9, 2022

(54) FLEXIBLE AND STRETCHABLE PRINTED CIRCUITS ON STRETCHABLE SUBSTRATES

(71) Applicant: W.L. Gore & Associates, Inc., Newark, DE (US)

(72) Inventors: Mark D. Edmundson, Philadelphia, PA (US); Paul D. Gassler, Lincoln University, PA (US)

(73) Assignee: W. L. Gore & Associates, Inc., Newark, DE (US)

( * ) Notice: Subject to any disclaimer, the term of this patent is extended or adjusted under 35 U.S.C. 154(b) by 0 days.

(21) Appl. No.: 17/051,125

(22) PCT Filed: May 8, 2018

(86) PCT No.: PCT/US2018/031555
§ 371 (c)(1),
(2) Date: Oct. 27, 2020

(87) PCT Pub. No.: WO2019/216885
PCT Pub. Date: Nov. 14, 2019

(65) Prior Publication Data
US 2021/0243890 A1    Aug. 5, 2021

(51) Int. Cl.
*H05K 1/02* (2006.01)
*H05K 1/11* (2006.01)
(Continued)

(52) U.S. Cl.
CPC ......... *H05K 1/0283* (2013.01); *H05K 1/0393* (2013.01); *H05K 1/097* (2013.01); *H05K 1/118* (2013.01)

(58) Field of Classification Search
CPC .... H05K 1/0283; H05K 1/0393; H05K 1/097; H05K 1/118
See application file for complete search history.

(56) References Cited

U.S. PATENT DOCUMENTS 3,953,566 A    4/1976  Gore
4,443,511 A    4/1984  Worden et al.
(Continued)

FOREIGN PATENT DOCUMENTS

CA    2900130 A1    10/2015
EP    0105629 A2    4/1984
(Continued)

OTHER PUBLICATIONS

Hong et al. "OmniDirectionally Stretchable and Transparent Graphene Electrodes", ACS Nano, 10:9446-9455 (2016).
(Continued)

*Primary Examiner* — Hoa C Nguyen
(74) *Attorney, Agent, or Firm* — Greenberg Traurig, LLP

(57) ABSTRACT

The present disclosure is flexible and stretchable conductive articles that include a printed circuit and a stretchable substrate. The printed circuit contains an electrically conductive trace. The electrically conductive trace may be positioned on the surface of or be imbibed into the pores through the thickness of a synthetic polymer membrane. The synthetic polymer membrane is compressed in the x-y direction such that buckling of the membrane occurs in the z-direction. Additionally, the synthetic polymer membrane may be porous or non-porous. In some embodiments, the synthetic polymer membrane is microporous. The printed circuit may be discontinuously bonded to the stretchable substrate. Advantageously, the flexible, conductive articles retain conductive performance over a range of stretch. In some embodiments, the conductive articles have negligible resistance change when stretched up to 50% strain. The printed circuits may be integrated into garments, such as smart apparel or other wearable technology.

28 Claims, 14 Drawing Sheets

(51) Int. Cl.
H05K 1/03 (2006.01)
H05K 1/09 (2006.01)

(56) References Cited

U.S. PATENT DOCUMENTS

| | | | |
|---|---|---|---|
| 4,557,957 | A | 12/1985 | Manniso |
| 4,720,400 | A | 1/1988 | Manniso |
| 4,972,846 | A | 11/1990 | Owens et al. |
| 4,985,296 | A | 1/1991 | Mortimer |
| 5,026,513 | A | 6/1991 | House et al. |
| 5,148,806 | A | 9/1992 | Fukui et al. |
| 5,183,545 | A | 2/1993 | Branca et al. |
| 5,188,890 | A | 2/1993 | Ohashi et al. |
| 5,269,810 | A | 12/1993 | Hull et al. |
| 5,476,589 | A | 12/1995 | Bacino |
| 5,524,908 | A | 6/1996 | Reis |
| 5,527,569 | A | 6/1996 | Hobson et al. |
| 5,753,358 | A | 5/1998 | Korleski |
| 5,785,787 | A | 7/1998 | Wojnarowski et al. |
| 5,885,738 | A | 3/1999 | Hannon |
| 5,904,978 | A | 5/1999 | Hanrahan et al. |
| 5,910,354 | A | 6/1999 | Meola et al. |
| 6,016,848 | A | 1/2000 | Egres |
| 6,210,789 | B1 | 4/2001 | Hanrahan |
| 6,218,000 | B1 | 4/2001 | Rudolf et al. |
| 6,379,745 | B1 | 4/2002 | Kydd et al. |
| 6,528,572 | B1 | 3/2003 | Patel et al. |
| 6,689,835 | B2 | 2/2004 | Amarasekera et al. |
| 6,737,158 | B1 | 5/2004 | Thompson |
| 7,306,729 | B2 | 12/2007 | Bacino et al. |
| 7,354,988 | B2 | 4/2008 | Charati et al. |
| 7,481,952 | B2 | 1/2009 | Ren et al. |
| 7,678,701 | B2 | 3/2010 | Tredwell et al. |
| 7,789,908 | B2 | 9/2010 | Sowinski et al. |
| 7,932,184 | B2 | 4/2011 | Ishii |
| 8,161,826 | B1* | 4/2012 | Taylor ............... G01L 1/18 73/862.044 |
| 8,278,757 | B2 | 10/2012 | Crain et al. |
| 8,974,739 | B2 | 3/2015 | Yoshida |
| 9,211,085 | B2* | 12/2015 | Streeter ............... A61B 5/6823 |
| 9,288,903 | B2 | 3/2016 | Hasegawa et al. |
| 9,441,088 | B2 | 9/2016 | Sbriglia et al. |
| 9,446,232 | B2 | 9/2016 | Duncan et al. |
| 9,573,339 | B2 | 2/2017 | Hodgins et al. |
| 9,926,416 | B2 | 3/2018 | Sbriglia |
| 9,932,429 | B2 | 4/2018 | Sbriglia |
| 2002/0094701 | A1* | 7/2002 | Biegelsen ............ H01L 25/0655 439/32 |
| 2003/0181568 | A1 | 9/2003 | Amarasekera et al. |
| 2004/0059717 | A1 | 3/2004 | Klare et al. |
| 2004/0173978 | A1 | 9/2004 | Bowen et al. |
| 2004/0192082 | A1 | 9/2004 | Wagner et al. |
| 2009/0008142 | A1* | 1/2009 | Shimizu ............... H05K 1/0366 174/261 |
| 2009/0227165 | A1 | 9/2009 | Imai |
| 2011/0167547 | A1 | 7/2011 | Jain |
| 2013/0160183 | A1 | 6/2013 | Reho et al. |
| 2013/0183515 | A1 | 7/2013 | White |
| 2014/0121557 | A1 | 5/2014 | John et al. |
| 2014/0242355 | A1 | 8/2014 | Castille |
| 2016/0032069 | A1 | 2/2016 | Sbriglia |
| 2016/0162774 | A1 | 6/2016 | Mei et al. |
| 2016/0167291 | A1 | 6/2016 | Zagl |
| 2016/0344308 | A1* | 11/2016 | Wang ............... H02N 1/04 |
| 2016/0358849 | A1 | 12/2016 | Jur |
| 2017/0171965 | A1* | 6/2017 | Youn ............... H05K 1/0283 |
| 2018/0067529 | A1 | 3/2018 | Jhong |
| 2018/0123482 | A1* | 5/2018 | Kim ............... H02N 1/04 |
| 2018/0192520 | A1* | 7/2018 | Choong ............ H01L 23/3121 |
| 2019/0290496 | A1 | 9/2019 | Brownhill et al. |

FOREIGN PATENT DOCUMENTS

| | | |
|---|---|---|
| EP | 0110626 A2 | 6/1984 |
| EP | 0317256 A2 | 5/1989 |
| EP | 3364728 A1 | 8/2018 |
| GB | 1409229 A | 10/1975 |
| JP | 1984064640 A | 4/1984 |
| JP | 1984187845 A | 10/1984 |
| WO | 9703812 A1 | 2/1997 |
| WO | 2004005413 A1 | 1/2004 |
| WO | 2016135188 A1 | 9/2016 |
| WO | 2017065272 A1 | 4/2017 |
| WO | 2017086583 A1 | 5/2017 |

OTHER PUBLICATIONS

Hu et al. "Inkjet Printing of Nanoporous Gold Electrode Arrays on Cellulose Membranes for High-Sensitive Paper-Like Electrochemical Oxygen Sensors Using Ionic Liquid Electrolytes", Anal. Chem., 84:3745-3750 (2012).
Jeong et al. "Solderable and elctroplatable flexible electronic circuit on a porous stretchable elastomer", Nat. Commun., DOI: 10.1038/ncomms1980, (2012).
Lim et al. "Surface Treatments for Inkjet Printing onto a PTFE-Based Substrate for High Frequency Applications", Ind. Eng. Chem. Res., 52:11564-11574 (2013).
Merilampi et al. "The characterization of electrically conductive silver ink patterns on flexible substrates", Microelectronics Reliability, 49: 782-790 (2009).
Paiz and Elmer "Adhesion of continuous Ink Jet Inks on PTFE", Wire and Cable Technology International—5 pgs May/Jun. 2013).
Park et al. "Design of conductive composite elastomers for stretchable electronics", Nano Today, 9:244-260 (2014).
Pu et al. "Highly Stretchable Microsupercapacitor Arrays with Honeycomb Structures for Integrated Wearable Electronic Systems", ACS Nano, 10:9306-9315 (2016).
Rogers et al., "Materials and Mechanics For Stretchable Electronics", Science 327:1603-1607 (2010).
Vuorinen et al. "Inkjet-Printer Graphene/PEDOT:PSS Temperature Sensors on a Skin Conformable Polyurethane Substrate", Scientific Reports, DOI: 10.1038/srep35289 (Oct. 2016).
Yao and Zhu, "Nanomaterial-Enabled Stretchable Conductors: Strategies, Material and Devices", Adv. Mater., DOI: 10.1002/adma.201404446, (2015).
Yetisen et al., "Nanotechnology in Textiles", ACS Nano, 10:3042-3068 (2016).

\* cited by examiner

FLEXIBLE AND STRETCHABLE PRINTED CIRCUITS ON STRETCHABLE SUBSTRATES

FIELD

The present disclosure relates generally to printed circuits, and more specifically, to flexible, stretchable printed circuits that are bonded to a stretchable substrate and which are able to maintain conductive performance over a range of stretch.

BACKGROUND

Conventionally, flexible circuits are built upon stiff materials such as Mylar® or Kapton®. While these materials are considered flexible in comparison to the traditional copper and fiberglass circuit boards, they do not exhibit flexibility that is comparable to that of textiles or skin. The incorporation of flexible circuits into garments and/or other skin-worn devices is limited by this stiffness. Indeed, many existing circuit materials are too stiff to be integrated into textiles and remain durably reliable, particularly upon flexing in use and during washing or other cleaning regimens.

In this regard, a number of conductive inks have been developed that are thin and stretchable. These inks are conventionally printed directly onto textiles and are able to retain the flexibility, stretch, and hand of the textile. However, they suffer from significant durability and electrical connectivity problems. For instance, when a textile is stretched, the textile fiber bundles move significantly relative to each other. The conductive inks are incapable of withstanding the elongation required to bridge the gap between the textile fiber bundles, resulting in breaks and open circuits.

The same stretchable conductive inks have been printed onto urethane films and then heat bonded to stretch textiles. This results in a more durable circuit than printing directly onto textiles, however the resulting laminate has significantly less stretch than the original textile. In other existing art, conductive inks have been sandwiched between insulative inks and then thermally laminated to textiles. However, thin coatings of the insulative inks are unable to effectively support the conductive ink. Increasing the thickness of the insulative ink can improve the durability, but only at great expense of the textile's stretchability.

Despite the advances in flexible electrical circuits, a need still exists for durable and effective flexible electrical circuit systems for a variety of applications ranging from garments to medical diagnostic and treatment devices, as well as many other suitable end use applications.

SUMMARY

One embodiment relates to a conductive article that has high flexibility and stretchability that includes a printed circuit bonded to a stretchable substrate. The printed circuit includes a synthetic polymer membrane that is compressed in the x-y direction and an electrically conductive trace located within the synthetic polymer membrane. The synthetic polymer membrane has a buckled orientation in the z-direction (i.e., out of the plane of the membrane). The electrically conductive trace may be imbibed or otherwise introduced into the pores and through the thickness of the synthetic polymer membrane. The electrically conductive trace includes a continuous network of conductive particles and may have the form of an electrically conductive pattern or circuit. In exemplary embodiments, non-conducting regions are located alongside the electrically conductive trace. In some embodiments, an insulative overcoat may be applied over the electrically conductive trace to assist in protecting the electrically conductive trace from external elements. The synthetic polymer membrane may be porous or non-porous. In some embodiments, the synthetic polymer membrane is a microporous membrane having a node and fibril structure. In at least one embodiment, the synthetic polymer membrane is an expanded polytetrafluoroethylene membrane. The stretchable substrate may be a stretchable textile or fabric, a stretchable nonwoven material, or an stretchable membrane. The conductive articles have negligible resistance change when stretched up to 50% strain of the original, relaxed configuration of the stretchable substrate. Also, the conductive articles are highly flexible, having a flexibility of less than 0.1 grams force-cm$^2$/cm as determined by the Kawabata test method.

Another embodiment relates to a conductive article that has high flexibility and stretchability that includes a printed circuit bonded to a stretchable substrate. The printed circuit includes a synthetic polymer membrane that is compressed in the x-y direction and an electrically conductive trace located on the synthetic polymer membrane. The synthetic polymer membrane may be porous or non-porous. The synthetic polymer membrane has a buckled orientation in the z-direction (i.e., out of the plane of the membrane). The electrically conductive trace includes a continuous network of conductive particles and may have the form of an electrically conductive pattern or circuit. In some embodiments, an insulative overcoat may be applied over the electrically conductive trace to assist in protecting the electrically conductive trace from external elements. Non-conducting regions may be located alongside the electrically conductive trace. The electrically conductive trace may include particles or nanoparticles of gold, silver, copper, or platinum. In some embodiments, the particles are at least partially fused to form a continuous network of conductive particles. The synthetic polymer membrane may be a microporous membrane having a node and fibril structure. In at least one embodiment, the synthetic polymer membrane is an expanded polytetrafluoroethylene membrane. The conductive articles have negligible resistance change when stretched up to 50% strain of the original, relaxed configuration of the stretchable substrate. Also, the conductive articles are highly flexible, having a flexibility of less than 0.1 grams force-cm$^2$/cm as determined by the Kawabata test method.

BRIEF DESCRIPTION OF THE DRAWINGS

The accompanying drawings are included to provide a further understanding of the disclosure and are incorporated in and constitute a part of this specification, illustrate embodiments, and together with the description serve to explain the principles of the disclosure.

DETAILED DESCRIPTION

Figure 1:
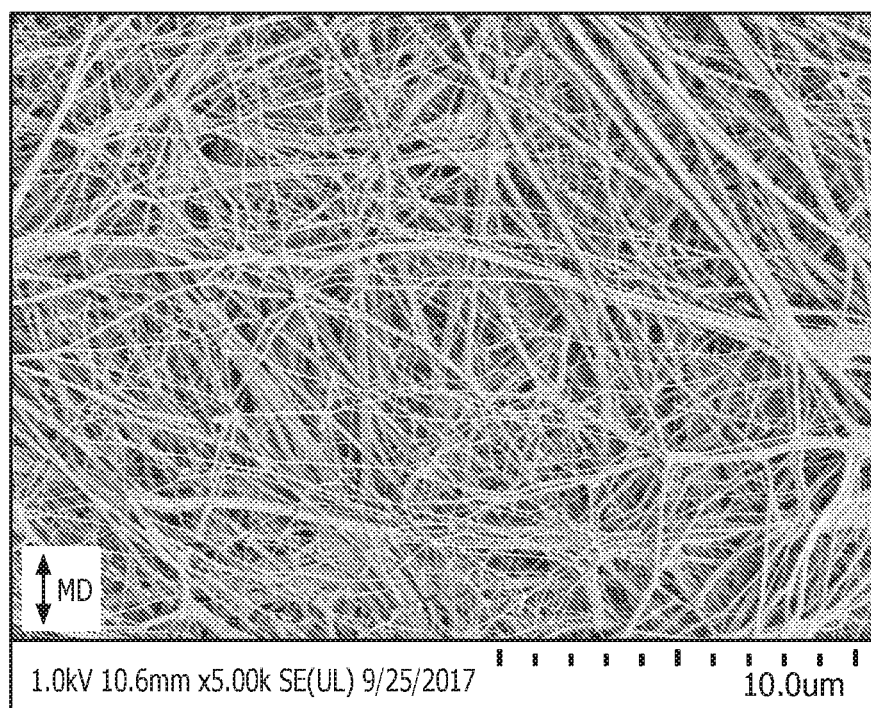
FIG. 1 is a scanning electron micrograph (SEM) image of a porous expanded polytetrafluoroethylene (ePTFE) membrane (Membrane 1) according to at least one embodiment.

Persons skilled in the art will readily appreciate that various aspects of the present disclosure can be realized by any number of methods and apparatus configured to perform the intended functions. It should also be noted that the accompanying figures referred to herein are not necessarily drawn to scale, but may be exaggerated to illustrate various aspects of the present disclosure, and in that regard, the figures should not be construed as limiting. It is to be appreciated that the terms "electrically conductive trace", "conductive trace", and "trace" may be used interchangeably herein. The terms "membrane" and "film" may be used interchangeably herein.

The present invention is directed to flexible and stretchable conductive articles that include a printed circuit and a stretchable substrate. The printed circuit contains a synthetic polymer membrane and an electrically conductive trace. The electrically conductive trace may be positioned on the surface of or be imbibed into the pores through the thickness of a synthetic polymer membrane. The printed circuit is compressed within the membrane plane such that buckling of the membrane occurs out of the membrane plane or in the "thickness" direction of the membrane. Additionally, the synthetic polymer membrane may be porous or non-porous. In some embodiments, the synthetic polymer membrane is microporous. The printed circuit may be discontinuously bonded to the stretchable substrate. Advantageously, the flexible, conductive articles retain conductive performance over a range of stretch. That is, the conductive articles have negligible resistance change when stretched up to 50% strain of the original, relaxed configuration of the stretchable substrate. "Strain", as defined herein, is meant to denote the extension of the synthetic polymer membrane relative to its original, relaxed configuration. In some embodiments, the conductive articles have negligible resistance change when stretched up to 100% strain or even over 100% strain. The printed circuits may be integrated into garments, such as smart apparel or other wearable technology.

As discussed above, the conductive articles include a printed circuit that includes at least one electrically conductive trace and a synthetic polymer membrane. The term "electrically conductive trace" as used herein is meant to describe a continuous line or continuous pathway that is able to conduct electrons therethrough. In exemplary embodiments, non-conducting regions are located alongside the electrically conductive trace on or within the synthetic polymer membrane. In some embodiments, an electrically conductive ink may be used to deposit the electrically conductive trace on or into the synthetic polymer membrane. The term "electrically conductive ink" as used herein refers to materials that incorporate electrically conductive particles in a carrier liquid (e.g. a solvent). In some embodiments, the electrically conductive particles include silver, gold, copper, or platinum particles. Non-limiting examples of suitable electrically conductive inks include 2108-IPA (Nanogap Inc., Richmond, Calif.), UTDAgPA (UT Dots, Inc., Champaign, Ill.), UTDAg60X (UT Dots, Inc., Champaign, Ill.), PE872 (DuPont, Wilmington, Del.), 125-19FS (Creative Materials, Inc., Ayer, Mass.), and CI1036 (Engineered Conductive Materials, Delaware, Ohio).

Non-limiting examples of other electrically conductive materials that form the electrically conductive trace include electrically conductive metal particles or nanoparticles (e.g., silver, gold, copper, and platinum), particles or nanoparticles of other electrically conductive materials (e.g., graphite or carbon black), electrically conductive nanotubes, electrically conductive metal flakes, electrically conductive polymers, and combinations thereof. As used herein, the term "nanoparticle" is meant to describe a particle that has a size from 1.0 nm to 100 nm in at least one dimension of the conductive particle.

The electrically conductive trace may be in the form of an electrically conductive pattern that can be used to form a circuit through which an electric current may flow. The pattern may create an open path, such as, for example, the parallel lines exemplified in FIG. 4 or the pattern depicted in FIG. 8. In some embodiments, electronic components (e.g., surface mount electronic components) may be electrically coupled (e.g., adhered) to a conductive trace pattern (such as the pattern shown in FIG. 8) to create a circuit, as depicted in FIG. 9. In the embodiment depicted in FIG. 9, the electronic components include: a 555 timer 910, an LED 920, a 470 k Ohm resistor 930, a 20 k Ohm resistor 940, a 100 k Ohm resistor 950, and a 10 microfarad capacitor 960. It was noted that when 3.7 volts was applied to the terminals 907, 908 in FIG. 9, the LED would flash. Stretching and relaxing the laminate did not affect the rate of flash or intensity of the LED. The electrically conductive trace may be configured to couple with resistors, capacitors, light emitting diodes (LED), integrated circuits, sensors, power sources, and data transmitters and receivers. Additionally, the electrically conductive trace may be used to transmit information, such as the user's heart rate or oxygen saturation in the blood to the user or the user's doctor, for example.

The conductive trace may be distributed onto the outer surface of a porous or non-porous synthetic polymer membrane and/or deposited in the pores of a porous (or microporous) synthetic polymer membrane. Non-limiting examples of suitable synthetic polymer membranes include polyurethanes, polytetrafluoroethylene (PTFE), expanded polytetrafluoroethylene (ePTFE), polyvinylidene fluoride (PVDF), fluorinated ethylene propylene (FEP), perfluoroalkoxy alkane (PFA), modified polytetrafluoroethylene polymers, tetrafluoroethylene (TFE) copolymers, polyalkylenes such as polypropylene and polyethylene, polyester sulfone (PES), polyesters, poly (p-xylylene) (ePPX) as taught in U.S. Patent Publication No. 2016/0032069, porous ultra-high molecular weight polyethylene (eUHMWPE) as taught in U.S. Pat. No. 9,926,416 to Sbriglia, porous ethylene tetrafluoroethylene (eETFE) as taught in U.S. Pat. No. 9,932,429 to Sbriglia, porous polylactic acid (ePLLA) as taught in U.S. Pat. No. 7,932,184 to Sbriglia, et al., porous vinylidene fluoride-cotetrafluoroethylene or trifluoroethylene [VDF-co-(TFE or TrFE)] polymers as taught in U.S. Pat. No. 9,441,088 to Sbriglia and copolymers and combinations thereof. In at least one embodiment, the synthetic polymer membrane is a microporous synthetic polymer membrane, such as a microporous fluoropolymer membrane having a node and fibril microstructure where the nodes are interconnected by the fibrils and the pores are the voids or space located between the nodes and fibrils throughout the membrane. An exemplary node and fibril microstructure is described in U.S. Pat. No. 3,953,566 to Gore.

The microporous membranes described herein may be differentiated from other membranes or structures in that they have a specific surface area of greater than about 4.0 $m^2/cm^3$, greater than about 10 $m^2/cm^3$, greater than about 50 $m^2/cm^3$, greater than about 75 $m^2/cm^3$, and up to 100 $m^2/cm^3$. In some embodiments, the specific surface area is from about 4.0 $m^2/cm^3$ and 100 $m^2/cm^3$. Herein, specific surface area is defined on the basis of skeletal volume, not envelope volume. In addition, the majority of the fibrils in the microporous synthetic polymer membrane have a diameter that is less than about 1.0 μm, or from about 0.1 μm to about 1.0 μm, from about 0.3 μm to about 1.0 μm, from about 0.5 μm to about 1.0 μm, or from about 0.7 μm to about 1.0 μm. Additionally, the microporous membranes are thin, having a thickness less than about 100 μm, less than about 75 μm, less than about 50 μm, less than about 35 μm, less than about 25 μm, less than about 20 μm, less than about 10 μm, less than about 5 μm, or less than about 3 μm. In at least one exemplary embodiment, the synthetic polymer membrane is an expanded polytetrafluoroethylene (ePTFE) membrane. Expanded polytetrafluoroethylene (ePTFE) membranes prepared in accordance with the methods described in U.S. Pat. No. 3,953,566 to Gore, U.S. Patent Publication No. 2004/0173978 to Bowen et al., U.S. Pat. No. 7,306,729 to Bacino et al., U.S. Pat. No. 5,476,589 to Bacino, or U.S. Pat. No. 5,183,545 to Branca et al. may be used herein.

Figure 10:
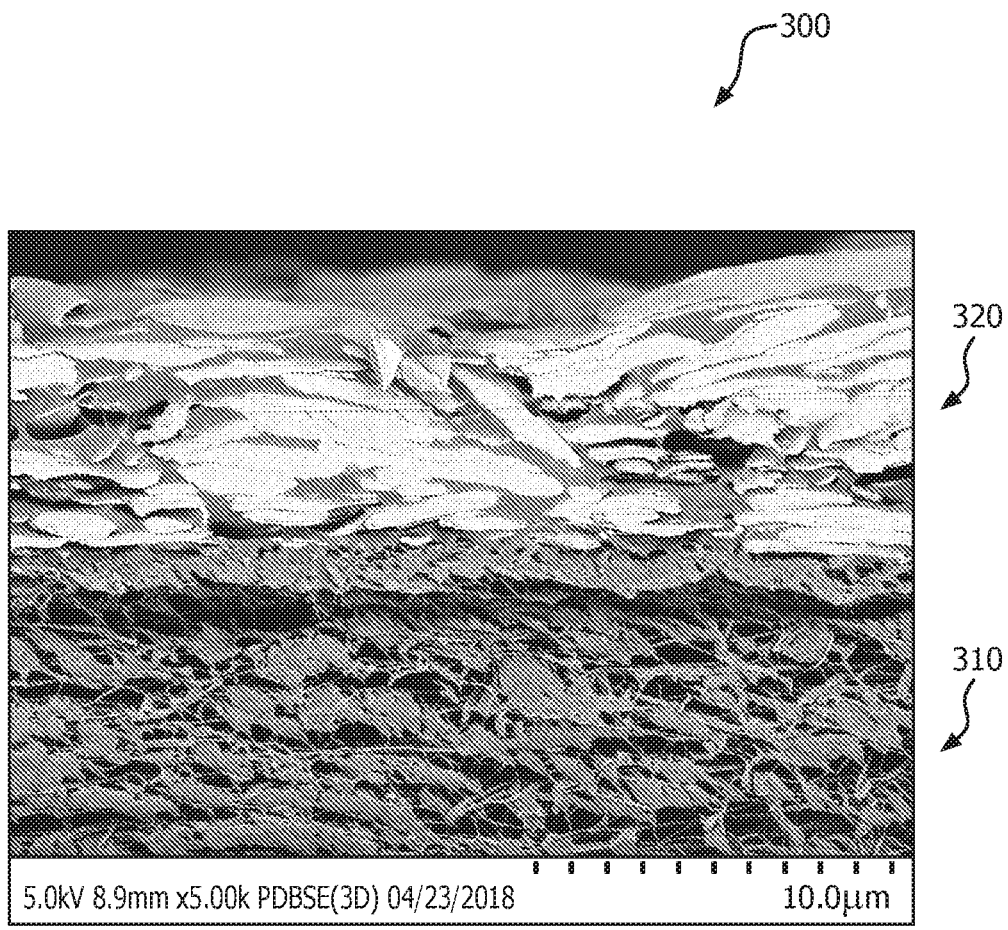
FIG. 10 is a scanning electron micrograph (SEM) of a portion of an expanded polytetrafluoroethylene membrane having thereon a conductive trace according to at least one embodiment.

In one embodiment, the conductive trace may be applied to the outer surface of the synthetic polymer membrane (e.g., a non-porous synthetic polymer membrane) to form a printed circuit. In some embodiments, the electrically conductive trace forms a monolithic (e.g., continuous) coating on portions of the outer surface of the synthetic polymer membrane. In at least one embodiment, a stencil having the desired pattern is applied to the surface of the synthetic polymer membrane. Other forms of forming a pattern on the surface of a synthetic polymer membrane known to those of skill in the art are considered to be within the purview of this disclosure. In exemplary embodiments, the synthetic polymer membrane is flat (i.e., planar) and contains no wrinkles when the electrically conductive material is applied. The electrically conductive material (e.g., an electrically conductive ink) is applied over the stencil such that once the stencil is removed, the electrically conductive material remains on the synthetic polymer membrane in the desired pattern, forming the electrically conductive trace. The electrically conductive material may be applied such that the electrically conductive trace is positioned on at least a portion of the outer surface of the synthetic polymer membrane to form the printed circuit. A scanning electron micrograph (SEM) 300 of a portion of an exemplary expanded polytetrafluoroethylene membrane 310 having thereon a conductive trace 320 is shown in FIG. 10. It is to be appreciated that the term "on" as used herein with respect to the conductive trace is meant to denote that the trace is on the surface of the synthetic polymer membrane (i.e., no electrically conductive material is located in the pores of the synthetic polymer membrane) or that the trace is substantially located on the surface of the synthetic polymer membrane (i.e., a negligible amount of an electrically conductive material may be located in the pores of the synthetic polymer membrane). "On" is also meant to denote that the electrically conductive trace may be positioned directly on the substrate (with no intervening elements) or that intervening elements may be present. Although not wishing to be bound by theory, it is believed that the negligible penetration (e.g., a micron) of the electrically conductive material into the pores of the synthetic polymer membrane results in an improved adhesion of the electrically conductive trace to the surface of the synthetic polymer membrane.

Figure 11:
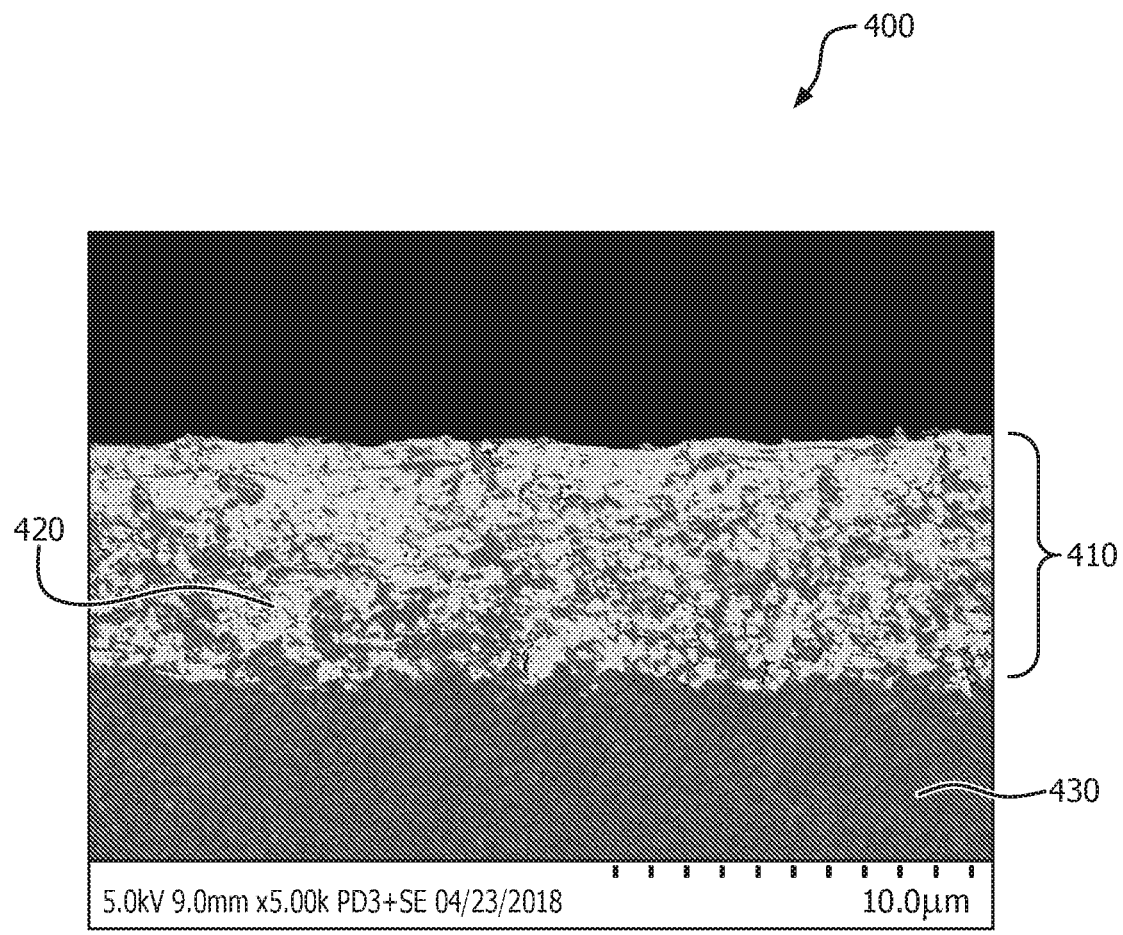
FIG. 11 is a scanning electron micrograph (SEM) of a portion of an expanded polytetrafluoroethylene membrane having imbibed therein a conductive trace according to at least one embodiment.

In another embodiment, the electrically conductive material (e.g., electrically conductive ink) may be applied to a porous or microporous synthetic polymer membrane such that the conductive material is imbibed into the synthetic polymer membrane to place the electrically conductive material, and thus the electrically conductive trace, within the synthetic polymer membrane and form a printed circuit. FIG. 11 is a scanning electron micrograph (SEM) 400 of a portion of an exemplary expanded polytetrafluoroethylene membrane 410 positioned on an SEM mounting tape 430 having imbibed therein a conductive trace 420. "Imbibed" as used herein is meant to describe the inclusion and/or deposition of an electrically conductive trace into the existing pores or void spaces of a porous or microporous synthetic polymer membrane via a liquid carrier (such as an electrically conductive ink) and specifically excludes filled membranes where the electrically conductive trace is an integral part of the synthetic polymer membrane and which may have some exposed electrically conductive trace within a pore or void space. It is to be noted that any known method of depositing electrically conductive material(s) into the pores or void spaces in a membrane may be utilized herein. In some embodiments, the electrically conductive trace occupies the pores through the thickness of a porous or microporous synthetic polymer membrane. As such, the electrically conductive trace may occupy the majority of the pore volume in the porous or microporous synthetic polymer membrane. In exemplary embodiments, the pores contain an amount of electrically conductive material that is sufficient to create a conductive trace for the passage of electrons therethrough. The electrically conductive material may be applied to the synthetic polymer membrane by known deposition, coating methods, and imbibing methods such as, for example, screen printing, over-coating, pad printing, flexographic printing, ink jet printing, and gravure printing to form the electrically conductive trace. The synthetic polymer membrane having thereon or therein an electrically conductive trace is referred to herein as a printed circuit.

Figure 13:
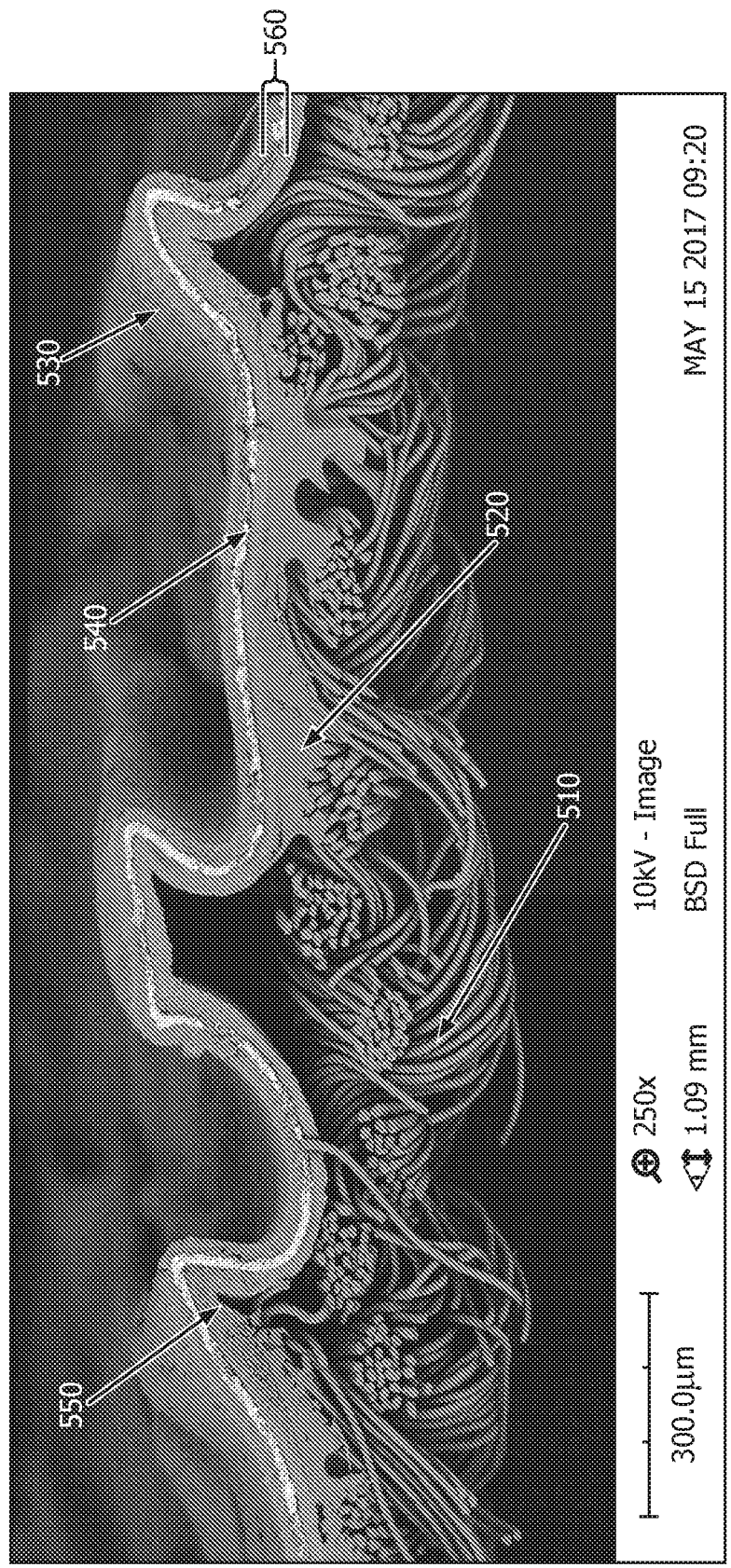
FIG. 13 is an SEM of an exemplary substrate in a relaxed configuration having thereon a buckled printed circuit according to at least one embodiment.

The printed circuit may be positioned on a stretched substrate such that, when the stretch substrate is released and reverts to its relaxed, unstretched state, buckling of the printed circuit occurs out of the plane of the membrane, or in the "thickness" direction of the synthetic polymer membrane, to introduce stretch into the printed circuit. FIG. 13 is an SEM of an exemplary stretchable substrate 510 (i.e., stretchable textile) having thereon a buckled printed circuit 560 formed of a synthetic polymer membrane 550 (i.e., expanded polytetrafluoroethylene membrane) and a conductive trace 540. The printed circuit 560 is attached the substrate 510 by a discontinuous adhesive 520. In the embodiment depicted in FIG. 13, an insulative overcoat 530 is positioned over the conductive trace 540 to protect the trace 540 from external forces. This planar compression of the printed circuit stores length in the synthetic polymer membrane. A variety of techniques may be used to introduce stretch into a printed circuit, such as by imparting stretch into a planar membrane (WO2016/135188 to Zaggl et al.; U.S. Patent Publication No. 2016/0167291 to Zaggl et al.; U.S. Pat. No. 5,026,513 to House et al.; U.S. Patent Publication No. 2013/183515 to White; U.S. Patent Publication No. 2011/167547 to Jain; U.S. Pat. No. 4,443,511 to Worden et al.; U.S. Patent Publication No. 2009/227165 to Imai, and U.S. Pat. No. 5,804,011 to Dutta, et al.). Mechanical and non-mechanical (e.g., thermal) processing techniques may be used.

One approach is to mechanically compress or buckle the printed circuit to wrinkle or produce out-of-plane structures within the printed circuit. In exemplary embodiments, the compression is conducted on a planar printed circuit. "Buckling" or a "buckled orientation" as used herein is meant to describe a printed circuit that shows out-of-plane structures, such as wrinkles, corrugations, or folds. Buckling may be introduced into the printed circuit in one or two directions. As used herein, "compressed in the x-y direction", "x-y compression", or "x-y compressing" refers to the introduction of stretch into the printed circuit via compression in one direction (i.e., "x" direction or "y" direction) or in both directions (i.e., "x" and "y" directions). The printed circuit may be compressed in the "x" and "y" directions either sequentially or simultaneously.

In at least one embodiment, the compression is conducted in one direction (e.g., "x" direction). The compression of the printed circuit in the "x" direction (e.g., in the membrane plane) may introduce "buckles" or structures that are out-of-plane (i.e., in the "z" direction). Such a process is generally disclosed in U.S. Patent Publication No. 2016/0167291 to Zaggl et al. in which a porous film is applied onto an stretchable substrate in a stretched state such that a reversible adhesion of the porous film on the stretched stretchable substrate occurs. The stretchable substrate is then relaxed with the applied porous film thereon to obtain a structured or compacted porous film. In an alternative embodiment taught in, WO2016/135188 to Zaggl et al. a porous membrane having a node a fibril structure may be compressed such that there is little or no introduction of a substantial structure in the "z" direction (i.e., fibril compaction within the node and fibril structure).

The "buckles" or out-of-plane structures in the printed circuit may have a height that is at least two times the thickness of the non-compressed printed circuit. In addition, the height of the out-of-plane (i.e. z-direction) structures may range from about 2 µm to about 2000 µm or from about 20 µm to about 1000 µm. Further, the structure density in at least one direction is at least 1 buckle per mm, at least 2 buckles per mm, at least 3 buckles per mm, at least 4 buckles per mm, at least 5 buckles per mm, at least 6 buckles per mm, at least 7 buckles per mm, at least 8 buckles per mm, at least 9 buckles per mm, or at least 10 buckles per mm. In some embodiments, the structure density is from 1 buckle per mm to 10 buckles per mm, from 1 buckle per mm to 7 buckles per mm, from 1 buckle per mm to 5 buckles per mm, or from 1 buckle per mm to 3 buckles per mm.

Figure 6A:
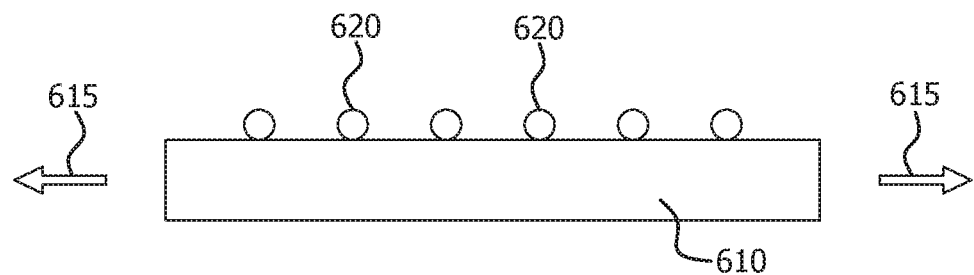
FIGS. 6A-C are schematic illustrations of the formation of a conductive article where the electrically conductive trace has been applied to the surface of the synthetic polymer membrane and buckled according to at least one embodiment.
Figure 6B:
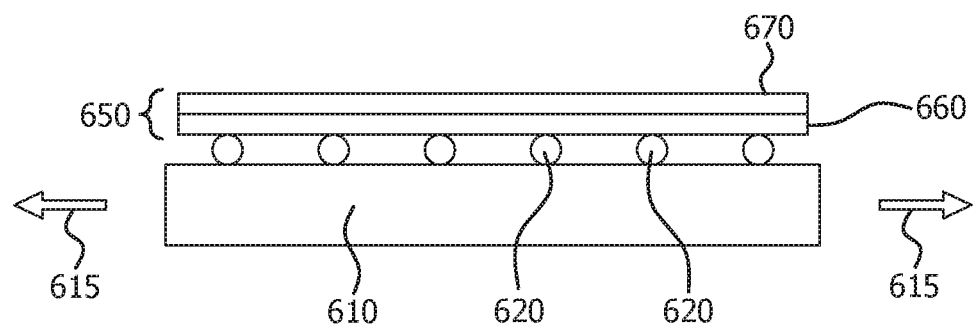

In some embodiments, to form a printed circuit, a stretchable substrate 610 is first stretched in the direction of arrows 615 (e.g., x-direction) prior to the application of the printed circuit 650 as shown in FIG. 6B. As used herein, the term "stretchable" is meant to denote a material that can be pulled in one or more directions, but when it is released, the material returns or substantially returns to its original shape. In addition, the stretchable substrate 610 has thereon a discontinuous adhesive, such as thermoplastic adhesive or thermoset adhesive. The adhesive may be applied in a pattern by a gravure printer in the form of adhesive dots 620, such as is shown in FIG. 6A. It is to be appreciated that the pattern of the adhesive on the stretchable substrate is not limited so long as the discontinuous adhesion of the printed circuit (or a continuous adhesion on the printed circuit) permits the printed circuit to be compressed in the x- and/or -y direction and buckle in the z-direction. Thus, other patterns, such as grids or parallel lines are considered to be within the purview of the invention so long as the printed circuit compresses in the x- and/or y-direction and buckles in the z-direction.

In some embodiments, the printed circuit (i.e., the synthetic polymer membrane with the conductive trace) is discontinuously attached to the stretched substrate by an adhesive, e.g. a thermoplastic adhesive, in its stretched state. The stretchable substrate may be stretched to 1.25 times, 1.5 times, 1.7 times, 2 times, 3 times, 4 times, 5 times, 6 times, 7 times, 8 times, 9 times, or 10 times its original, relaxed length (or more), depending on the elasticity of the stretchable substrate. In some embodiments, the stretchable substrate is stretched until the elastic limit of the substrate is reached.

Once the stretchable substrate 610 is stretched to its desired amount, the printed circuit 650 containing the synthetic polymer membrane 660 and conductive trace 670 is positioned over the stretched substrate 610 and is attached to the stretched substrate via the adhesive dots 620 previously attached to the stretchable substrate 610, as is shown in FIG. 6B. It is to be appreciated that the conductive trace 670 may be positioned such that it faces away from the stretched substrate 610 as depicted in FIG. 6B, or the conductive trace 670 may be positioned such that it faces towards the stretched substrate (not depicted). The stretchable substrate 610 having thereon the printed circuit 650 is then allowed to return to its non-stretched (i.e., relaxed) state in the direction of arrows 625, as depicted in FIG. 6C, thereby compressing the printed circuit in the x-direction and buckling the membrane in the z-plane to form out-of-plane structures (e.g., wrinkles, corrugations, or folds).

The printed circuit 650 (including the synthetic polymer membrane 660) demonstrates out-of-plane geometries such as wrinkles or folds in the z-direction in the synthetic polymer membrane such as, but not limited to, those described in conjunction with the methods set forth in EP3061598 A1 to Zaggl et al. and U.S. Pat. No. 9,849,629 to Zaggl, et al. In such embodiments, the synthetic polymer membrane has a buckled orientation. Examples of stretchable substrates that may be used include, but are not limited to, a stretchable textile or fabric, a stretchable nonwoven material, or an stretchable membrane.

Figure 6C:
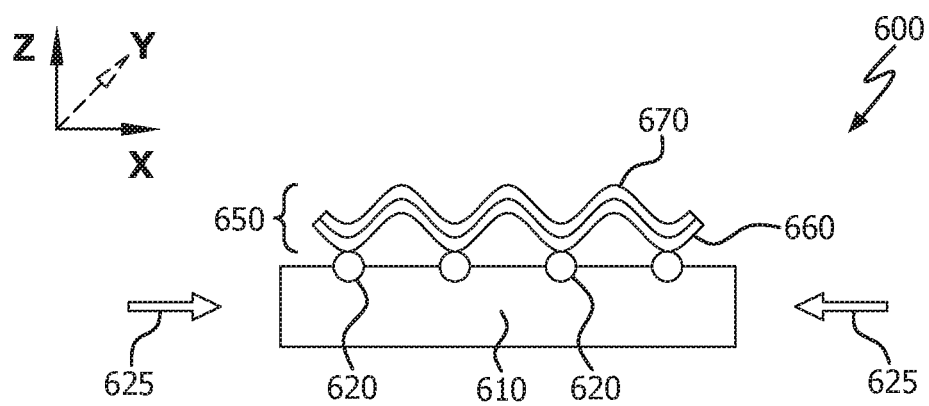

The conductive article 600 formed in FIG. 6C illustrates an embodiment where the conductive trace 670 has been applied to the surface of the synthetic polymer membrane 660, such as by printing the trace 670 on the synthetic polymer membrane 660 and been allowed to retract to its relaxed configuration in the direction of arrows 625. It can be seen in FIG. 6C that the conductive trace 670 and synthetic polymer membrane 660 have a buckled orientation, with discrete adhesion points to the stretchable substrate 610 at the thermoplastic dots 620. This buckling permits the printed circuit 650 to move with the stretchable substrate 610 as it is stretched in one or more directions without breaking the conductivity in the conductive trace 670.

Figure 6D:
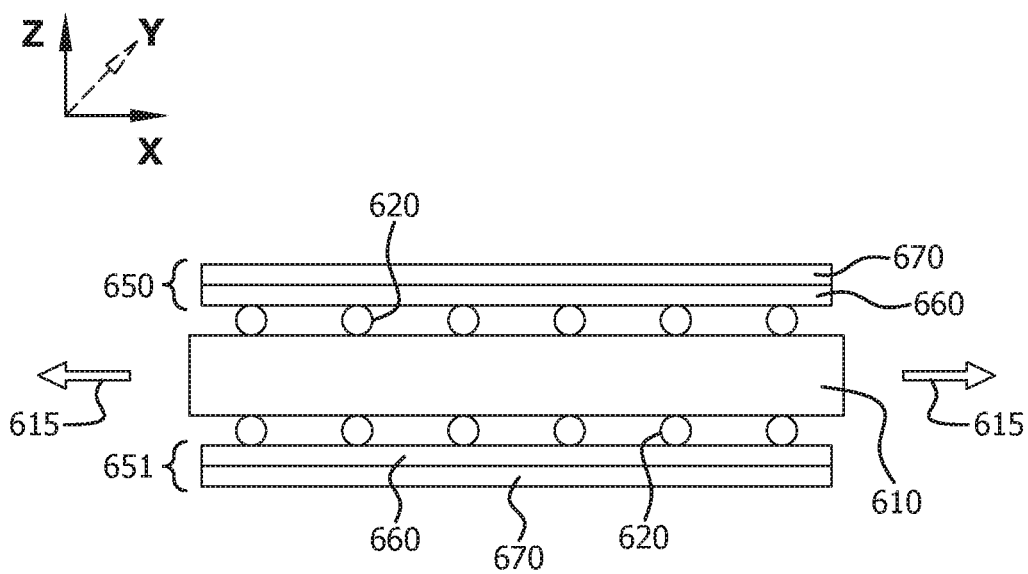
FIG. 6D is a schematic illustration of the application of a printed circuit to both sides of the stretchable substrate according to at least one embodiment.
Figure 6E:
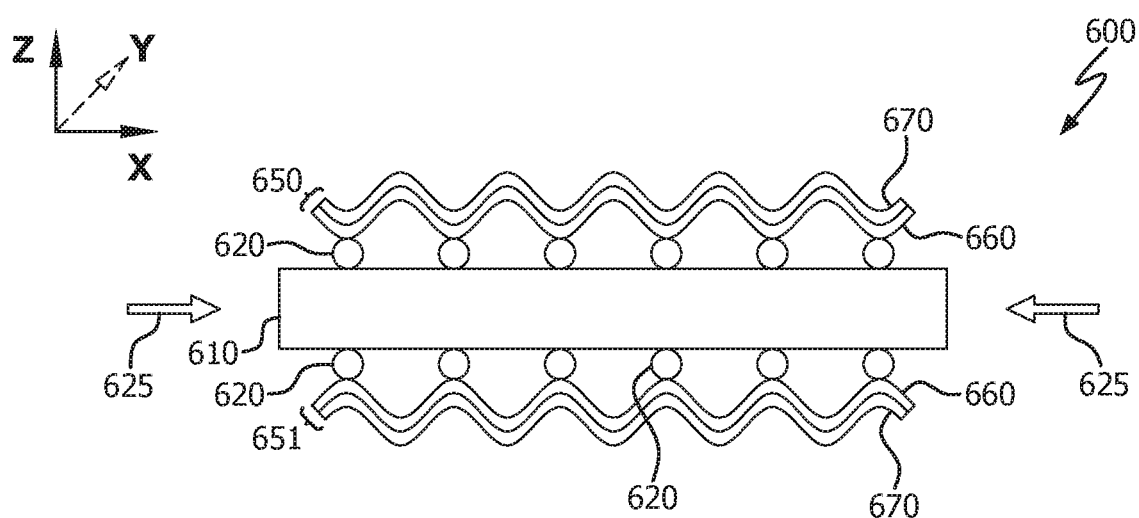
FIG. 6E is a schematic illustration of a stretchable substrate having thereon a buckled synthetic polymer membrane on each side thereof according to at least one embodiment.

In some embodiments, printed circuits 650, 651, each having a synthetic polymer membrane 660 and a conductive trace 670) may be applied to both sides of the stretched substrate 610 (i.e., stretched in the direction of arrows 615) as shown in FIG. 6D. In other words, printed circuit 650 may be positioned on one side of the stretched substrate 610 and printed circuit 651 may be positioned on the opposing side of the stretched substrate. Similar to the embodiment depicted in FIG. 6C, the stretched substrate 610 is allowed to return to is non-stretched, relaxed state in the direction of arrows 625, thereby compressing the printed circuits 650, 651 in the x-direction and buckling the synthetic polymer membranes 660 in the z-plane to form out-of-plane structures (e.g., wrinkles, corrugations, or folds) as shown in FIG. 6E. It is to be noted that the synthetic polymer membranes 660 and the conductive traces 670 in the printed circuits 650, 651 may be the same or different from each other.

Figure 6F:
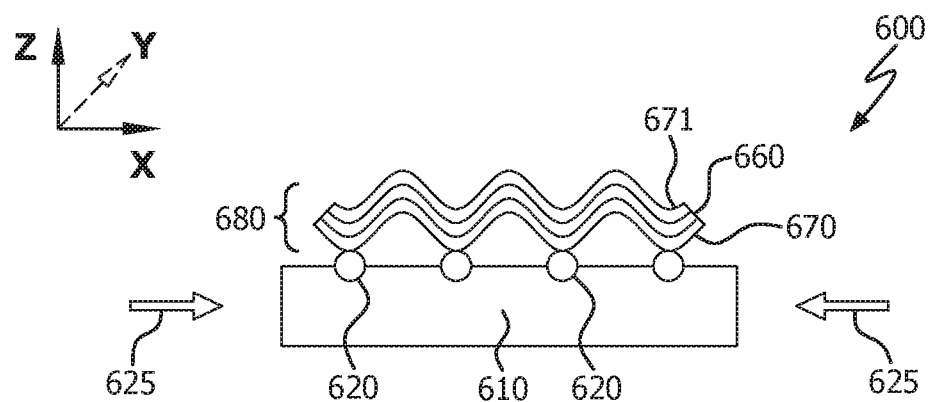
FIG. 6F is a schematic illustration of a synthetic polymer membrane having electrically conductive trace on both sides thereof in a buckled configuration.
Figure 6G:
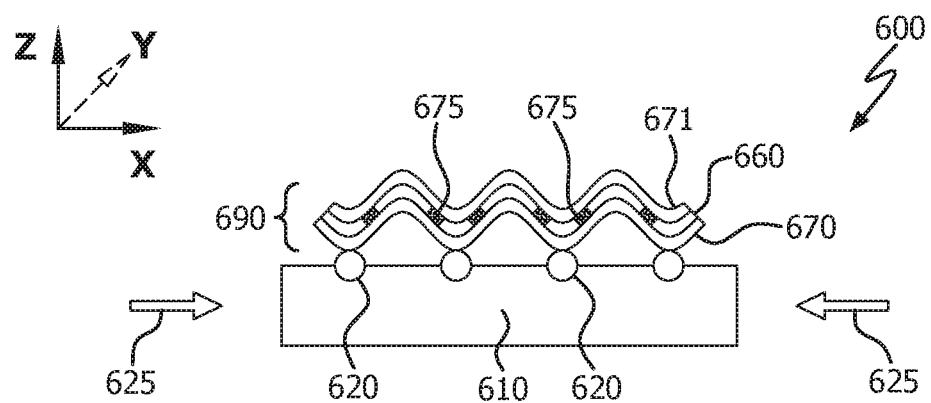
FIG. 6G is a schematic illustration of a synthetic polymer membrane having electrically conductive trace on both sides thereof and imbibed electrically conductive traces electrically interconnecting the electrically conductive traces where the synthetic polymer membrane is in a buckled configuration.

In some embodiments, as shown in FIG. 6F, an electrically conductive trace 670 and an electrically conductive trace 671 may be located opposing sides of the synthetic polymer membrane 660, forming the printed circuit 680. As depicted in FIG. 6G, an electrically conductive trace 670 is positioned on one side of the synthetic polymer membrane 660 and electrically conductive trace 671 is positioned the opposing side of the synthetic polymer membrane 660 and vertical interconnect accesses (VIA) 675 allow the electrically conductive traces 670, 671 to communicate electrically with each other, and form flexible circuit 690. The VIAs 675 may be formed by creating a through hole in the synthetic polymer membrane and filling the hole with electrically conductive material. Alternatively, the VIA may be formed by imbibing the electrically conductive material through the thickness of the porous synthetic polymer membrane, without the need to first create a through hole. It is to be noted that electrically conductive traces 670, 671 may be the same or different from each other.

In some embodiments, the stretchable substrate 610 can be stretched up to 50% strain of the original, relaxed configuration of the stretchable substrate while maintaining conductivity. In other words, the resistance of the printed circuit remains substantially unchanged as the flexible circuit is elongated to 50% strain. That is, the resistance of the printed circuit remains substantially unchanged as the flexible circuit is elongated to 50% strain. For example, if the printed circuit was 10 mm, it could be stretched to a length of 15 mm without loss or significant loss of resistance. In other embodiments, the printed circuits have negligible resistance change when stretched up to 100% or even greater than 100% of the original, relaxed configuration of the stretchable substrate. The corrugations or buckling allow the conductive trace to stretch freely in one or more directions with nearly the same characteristics as the stretch textile without a printed circuit thereon.

Figure 7A:
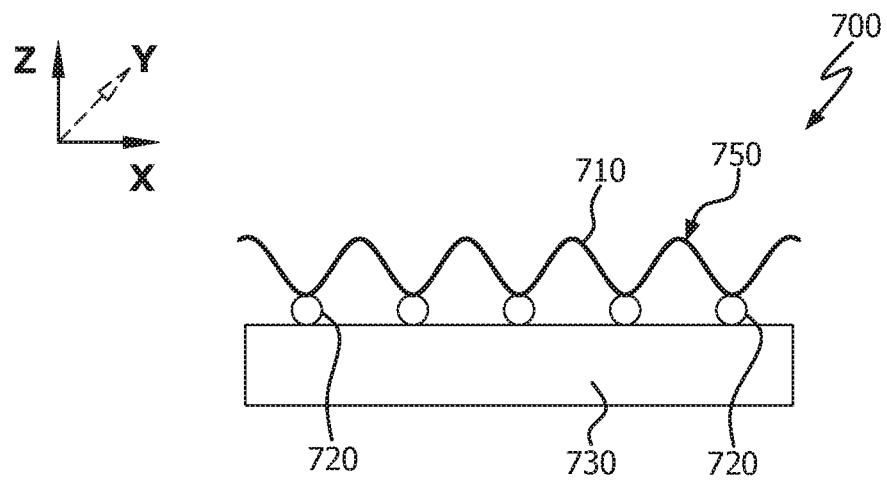
FIG. 7A is a schematic illustration of a conductive article where the electrically conductive trace has been imbibed into the synthetic polymer membrane and buckled according to at least one embodiment.
Figure 7B:
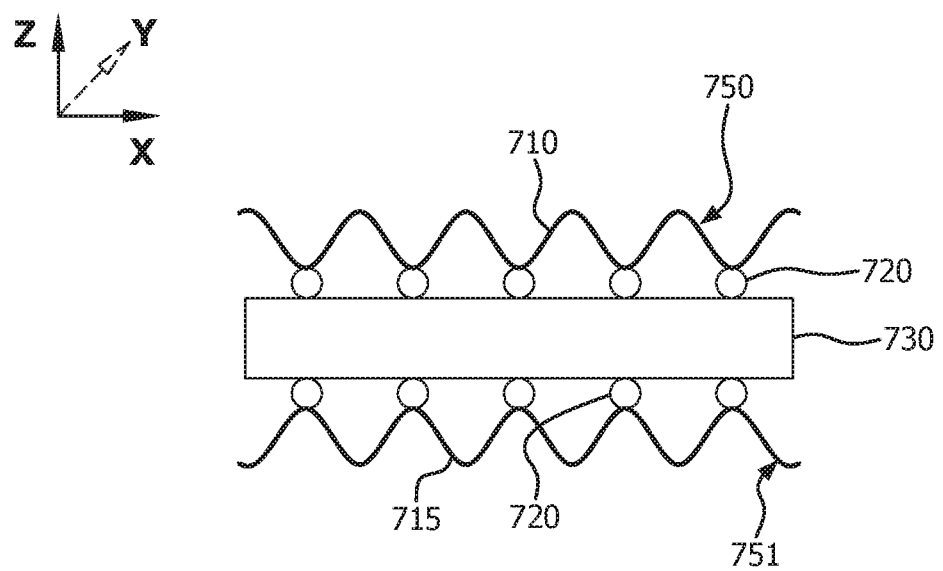
FIG. 7B is a schematic illustration of a conductive article having a bucked synthetic polymer membrane on each side of the stretchable substrate according to at least one embodiment.

In an alternate embodiment, shown in FIG. 7A, the electrically conductive trace is imbibed into the synthetic polymer membrane 710, forming the printed circuit 750. It is to be noted that the structure of the conductive article 700 is the same as that shown in FIGS. 6A-6C with the exception that the conductive trace has been imbibed into the synthetic polymer membrane 710 and as such, is not separately depicted. It is to be appreciated that a negligible amount conductive material may remain on the surface or on portions of the surface of the synthetic polymer membrane as a consequence of the imbibing process. The printed circuit 750, which includes the synthetic polymer membrane 710 containing therein the conductive trace, has a buckled configuration on the stretchable substrate 730 when the stretchable substrate 730 is in its relaxed (non-stretched) state. The printed circuit 750 (including the synthetic polymer membrane 710) is discretely attached to the stretchable substrate 730 by adhesive dots 720 (e.g., thermoplastic or thermoset adhesive dots). The buckling of the synthetic polymer membrane 710 in the z-plane permits the printed circuit 750 to move with the stretchable substrate 730 as it is stretched in one or more directions without breaking the conductivity in the conductive trace. In another embodiment depicted in FIG. 7B, synthetic polymer membranes 750, 751, each having therein conductive trace, are each applied to one side of the substrate 730 by discrete adhesive dots 720. The buckling of the synthetic polymer membranes 710, 715 in the z-plane permits the printed circuits 750, 751 to move with the stretchable substrate 730 as it is stretched in one or more directions without breaking the conductivity in the conductive trace. it is to be noted that the synthetic polymer membranes 710, 715 and conductive traces therein may be the same or different from each other.

Although not depicted in any figure, it is to be appreciated that some conductive trace may be located on the surface or on portions of the synthetic polymer membrane as a consequence of the imbibing process. In embodiments where the conductive trace is applied via a liquid carrier (e.g. an electrically conductive ink) heat may be applied to the printed circuit to remove the liquid carrier. The temperature applied may be sufficient to at least partially fuse the conductive trace (e.g., metal particles) within the synthetic polymer membrane to form a continuous network of conductive particles. In other embodiments, such as where the conductive trace is applied to the surface of the synthetic polymer membrane, heat may be applied to the printed circuit to at least partially melt the conductive trace (e.g., metal particles) to form a continuous network of conductive particles on the surface of the synthetic polymer membrane. In other embodiments, heat be used to remove ligands or other processing aids from the conductive particles.

In some embodiments, an insulative overcoat may be applied over the electrically conductive trace to assist in protecting the electrically conductive trace from external elements, such as, but not limited to, abrasion. Non-limiting examples of materials used to insulate the electrically conductive trace include urethanes (delivered as a solution), acrylics (delivered as a liquid), silicones, Styrene Isoprene Butadiene Block Copolymers, Viton FKM (a synthetic rubber and fluoropolymer elastomer), polyolefins, or fluoropolymers.

Advantageously, the conductive articles described herein are highly flexible, having a flexibility of less than 0.1 grams force-cm$^2$/cm as evidenced by the Kawabata test set forth below. Additionally, the conductive articles are highly durable and are able to withstand multiple washings while still maintaining conductivity in the printed circuit. Further, the conductive articles are highly stretchable, as defined by the Stretch v. Resistance test set forth herein. Also, the conductive articles are also highly breathable, having an MVTR of at least 2,000 as evidenced by the Moisture Vapor Transmission Rate (MVTR) test described herein.

Test Methods

It should be understood that although certain methods and equipment are described below, other methods or equipment determined suitable by one of ordinary skill in the art may be alternatively utilized.

Resistance Measurement v. Stretch

Figure 4:
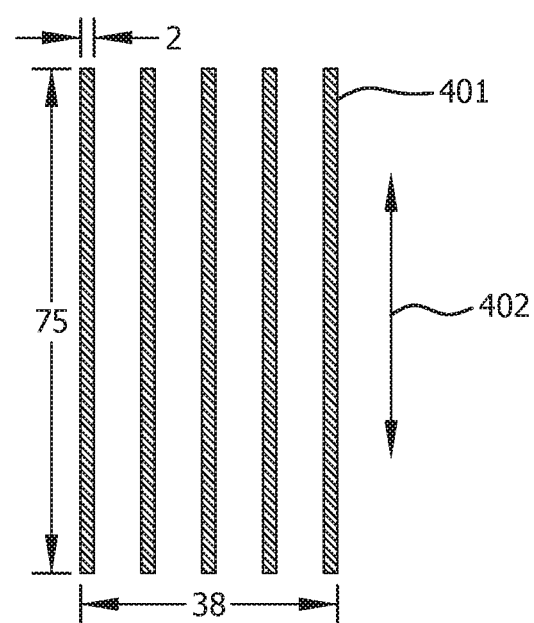
FIG. 4 is a graphical illustration of the arrangement and size of exemplary conductive traces used in Examples according to at least one embodiment.

A bucked textile containing thereon a printed circuit in the pattern depicted in FIG. 4 was were trimmed so that a single printed conductive line 401 shown in FIG. 4 was centered within a 15 mm wide strip. The strip was mounted in the grips of an INSTRON® model 5965, gripping the laminate so that there was a 5 mm gap between each end of the printed conductive line and the grip. The grips were moved apart until the force gauge registered between −0.1 newton and 0.1 newton. The gauge length was zeroed and the matching source and sense leads of a KEITHLY® 580 micro ohm-meter (Tektronix, Inc., Beaverton, Oreg., USA) were each connected to the two ends of the printed line 401. The load cell was zeroed and the sample was strained to 50% and then back to 0% at 60 mm/minute. Resistance was measured at 10% strain increments for both extension and compression phases of the test cycle.

ATEQ Airflow

ATEQ Airflow is a test method for measuring laminar volumetric flow rates of air through membrane samples. For each membrane, a sample was clamped between two plates in a manner that seals an area of 2.99 cm$^2$ across the flow pathway. An ATEQ® (ATEQ Corp., Livonia, Mich.) Premier D Compact Flow Tester was used to measure airflow rate (L/hr) through each membrane sample by challenging it with a differential air pressure of 1.2 kPa (12 mbar) through the membrane.

Gurley Airflow

The Gurley air flow test measures the time in seconds for 100 cm$^3$ of air to flow through 1 in$^2$ (~6.45 cm$^2$) sample at 0.177 psi (~1.22 kPa) of water pressure. The samples were measured in a GURLEY™ Densometer and Smoothness Tester Model 4340 (Gurley Precision Instruments, Troy, N.Y.). The values reported are an average of 3 measurements and are in the units of seconds.

Non-Contact Thickness

Figure 12A:
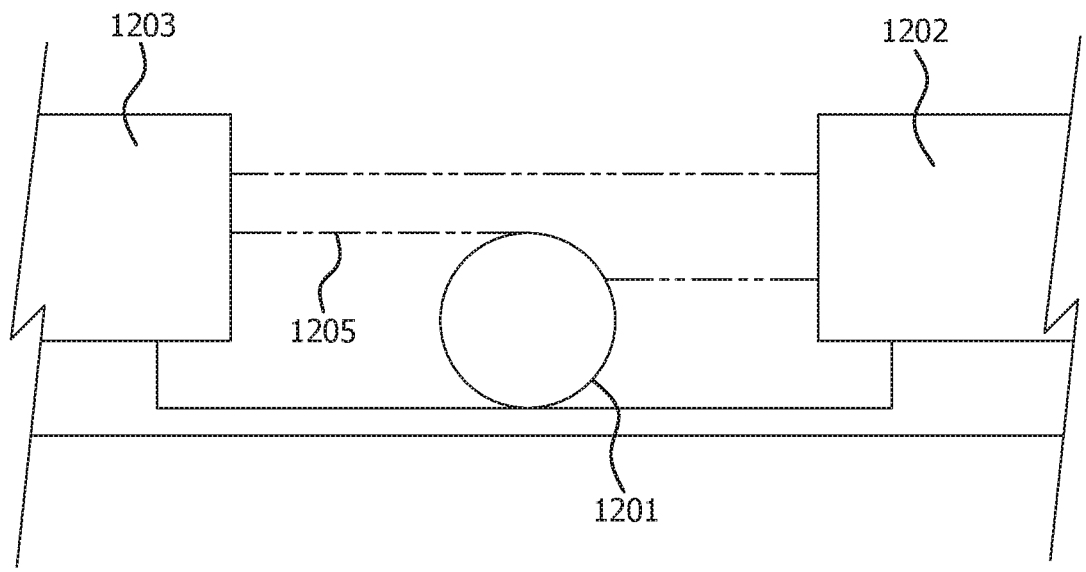
FIG. 12A is a schematic illustration of a metal cylinder aligned between a laser micrometer source and a laser micrometer receiver for measuring thickness of the synthetic polymer membrane when using a laser micrometer according to at least one embodiment.
Figure 12B:
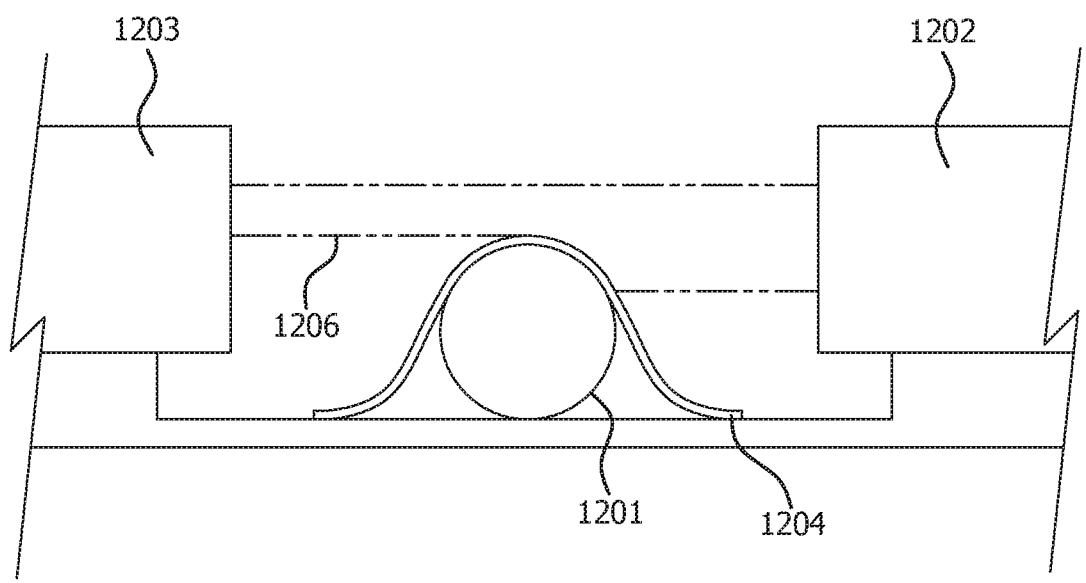
FIG. 12B is a schematic illustration of a single layer of membrane draped over the surface of the metal cylinder shown in FIG. 12A without overlap and without wrinkles when measuring the thickness of the synthetic polymer membrane when using a laser micrometer according to at least one embodiment.

Non-contact thickness was measured using a laser micrometer (Keyence model no. LS-7010, Mechelen, Belgium). As shown in FIGS. 12A and B, a metal cylinder 1201 was aligned between a laser micrometer source 1202 and a laser micrometer receiver 1203. The shadow 1205 of the top of the cylinder 1201 is projected onto receiver 1203 as shown in FIG. 12A. The position of the shadow was then reset as the "zero" reading of the laser micrometer. As shown in FIG. 12B, a single layer of membrane 1204 is draped over the surface of the metal cylinder 1201 without overlap and without wrinkles, casting shadow 1206 onto the receiver 1203. The laser micrometer then indicated the change in the position of the shadows 1205 and 1206 as the thickness of the sample. Each thickness was measured three times and averaged for each sample.

Mass Per Area (Mass/Area)

The mass per area of samples was measured according to the ASTM D 3776 (Standard Test Methods for Mass Per Unit Area (Weight) of Fabric) test method (Option C) using a Mettler-Toledo Scale, Model 1060. The scale was recalibrated prior to weighing specimens, and the results were reported in grams per square meter (g/m$^2$).

Wash Testing Durability

Wash testing was performed in a Kenmore washer (80-Series). The weight of the load was 1814.4±113.4 grams. The water level was 18±1 gallons (~68.1±3.79 L). The washer setting was 12 min Cotton Sturdy. The wash temperature was 120±5° F. (~48.9±2.78° C.). The laundry detergent was Original Tide powder (3700085006). The amount of soap was 11.0±0.1 grams. Drying was performed in a Kenmore 600 dryer. The dryer setting was Cotton Sturdy. The auto moisture sensing feature was set to Normal Dry, and ended the drying cycle when the samples were dry. One complete wash durability cycle consists of one wash cycle and one dry cycle. The resistance of each conductive trace was measured after 0, 1, 3, 6, 10, 15, and 20 cycles in the following manner: A KEITHLEY® 2750 multimeter system (Tektronix, Inc., Beaverton, Oreg., USA) was used to make 2-point probe measurements of DC resistance. The synthetic polymer membranes were laid flat to remove large wrinkles, but the substrates (i.e., fabrics) were left in their relaxed states (i.e., they were not stretched). Positive and negative probes were placed by hand on opposite ends of each trace and the value of resistance was recorded. The number of traces tested was 5. Wash testing durability was reported as the number of wash cycles before 50% of the traces exceeded 1 Megaohm (MΩ) resistance.

Moisture Vapor Transmission Rate (MVTR) Measurement

Approximately 70 mL of a solution consisting of 35 parts by weight of potassium acetate and 15 parts by weight of distilled water was placed into a 133 mL polypropylene cup having an inside diameter of 6.5 cm at its mouth. An expanded polytetrafluoroethylene (PTFE) membrane having a minimum MVTR of approximately 85,000 g/m$^2$/24 hr as tested by the method described in U.S. Pat. No. 4,862,730 to Crosby, was attached to the lip of the cup using a rubber band to create a taut, leak-proof, microporous barrier containing the potassium acetate solution.

A similar expanded PTFE membrane was mounted to the surface of a water bath. The water bath assembly was controlled at 23±0.2° C., utilizing a temperature controlled room and a water circulating bath.

The sample to be tested was allowed to condition at a temperature of 23° C. and a relative humidity of 50% prior to performing the test procedure. Samples were placed so that the conductive traces were facing away from the expanded polytetrafluoroethylene membrane mounted to the surface of the water bath and allowed to equilibrate for at least 15 minutes prior to the introduction of the cup assembly. The cup assembly was weighed to the nearest 1/1000 g and was placed in an inverted manner onto the center of the test sample.

Water transport was provided by the driving force between the water in the water bath and the saturated salt solution providing water flux by diffusion in that direction. The sample was tested for 15 minutes and the cup assembly was then removed and weighed again within 1/1000 g.

The MVTR of a sample was calculated from the weight gain of the cup assembly and was expressed in grams of water per square meter of sample surface area per 24 hours.

Matrix Tensile Strength Determination

A synthetic polymer membrane was cut in each of the longitudinal and transverse directions using an ASTM D412-Dogbone F. The "machine direction" is in the direction of the extrusion and the "transverse direction" is perpendicular to this. The membrane was placed on a cutting table such that the membrane was free from wrinkles in the area in which the membrane was to be cut. A die was then placed on the membrane (generally in the center 200 mm of the membrane) such that its long axis was parallel to the direction that would be tested. Once the die was aligned, pressure was applied to cut through the synthetic polymer membrane. Upon removal of the pressure, the dogbone sample was inspected to ensure it was free from edge defects which may impact the tensile testing. At least 3 samples in the machine direction and three samples in the transverse direction were prepared in this manner. Once the dogbone samples were prepared, they were measured to determine their mass using, a Mettler Toledo scale, model AG204.

Tensile break load was measured using an INSTRON® 5500R (Illinois Tool Works Inc., Norwood, Mass.) tensile test machine equipped with a rubber coated face plate and a serrated face plate such that each end of the sample was held between one rubber coated plate and one serrated plate. The pressure that was applied to the grip plates was approximately 552 kPa. The gauge length between the grips was set at 58.9 mm and the crosshead speed (pulling speed) was set to a speed of 508 mm/min. A 500 N load cell was used to carry out these measurements and data was collected at a rate of 50 points/sec. The laboratory temperature was between 20 and 22.2° C. to ensure comparable results. If the sample broke at the grip interface, the data was discarded. At least 3 samples in the machine direction and three samples in the transverse direction were successfully pulled (no slipping out of or breaking at the grips) in order to characterize the sample.

The following equation was used to calculate the matrix tensile strength:

$MTS = ((Fmax/w)*p)/mass:area$, in which:

MTS=matrix tensile strength in MPa,
Fmax=maximum load measured during test (newtons),
w=width of dogbone sample within the gauge length (meters),
p=density of PTFE ($2.2 \times 10^6$ g/m$^3$) or density of polyethylene (0.94 g/m$^3$), and
mass:area=mass per area of the sample (g/m$^2$).

Kawabata Flexibility Measurement

The low force bending behavior of the laminated sample was measured using a Kawabata Pure Bending Tester (KES-FB2-Auto-A; Kato Tech Co. LTD, Kyoto, Japan). The laminated sample was cut to a width of 7 cm with the printed pattern approximately centered and the printed lines running perpendicular to the 7 cm width. The sample was positioned within the grips of the bending tester so that the printed lines spanned the gap between the grips. The machine sensitivity was set to 10. The machine automatically tightened the grips and bent the laminated sample to a curvature of 2.5 cm$^{-1}$ in both directions while recording the applied load. The B-mean value reported is the average of the bending stiffness of the laminated sample when it was bent between 0.5 and 1.5 cm$^{-1}$ and −0.5 and −1.5 cm$^{-1}$. The bending stiffness is reported in grams force cm$^2$/cm.

Bubble Point

Bubble point pressures were measured according to the general teachings of ASTM F31 6-03 using a Capillary Flow Porometer (Model 3Gzh from Quantachrome Instruments, Boynton Beach, Fla.). The sample membrane was placed into the sample chamber and wet with Silwick Silicone Fluid (available from Porous Materials Inc.) having a surface tension of 20.1 dynes/cm. The bottom clamp of the sample chamber had a 2.54 cm diameter, 0.159 cm thick porous metal disc insert (Quantachrome part number 75461 stainless steel filter) and was used to support the sample. Using the 3GWin software version 2.1, the following parameters were set as specified in the table immediately below. The values presented for bubble point pressure are the average of two measurements. Bubble point pressure was converted to pore size using the following equation:

$DBP = 4\gamma lv \cos \theta / PBP$ where DBP is the pore size, γlv is the liquid surface tension, θ is the contact angle of the fluid on the material surface, and PBP is the bubble point pressure. It is understood by one skilled in the art that the fluid used in a bubble point measurement must wet the surface of the sample.

Bubble Point Instrument Settings

| Parameter | |
|---|---|
| Run Settings | |
| Starting pressure | 2.12 psig |
| Ending pressure | 85.74 psig |
| Sample Area | 3.14 cm$^2$ |
| Run Type | Wet Only |
| Number Data Points | 256 |
| Pressure Control | |
| Use Normal Equilibrium | TRUE |
| Use Tol | FALSE |
| Use Time | FALSE |
| Use Rate | FALSE |
| Use Low Flow Sensor | FALSE |
| Time Out | NA |
| Equil Time | NA |
| Run Rate | NA |
| Pressure Tolerance | NA |
| Flow Tolerance | NA |
| Smoothing | |
| UseMovAve | FALSE |
| MovAveWet Interval | NA |
| MovAveDry Interval | NA |
| Lowess Dry | 0.050 |
| Lowess Wet | 0.050 |

-continued

| Parameter | |
|---|---|
| Lowess Flow | 0.050 |
| Lowess Num | 0.100 |
| MinSizeThreshold | 0.98 |
| Bubble Point Parameters | |
| UseBpAuto | TRUE |
| UseBpThreshold (L/min) | FALSE |
| UseBpThreshold (Abs/cm2) | FALSE |
| UseBpThresholdNumber | FALSE |
| BpAutoTolerance (manual) | 1% |
| BpThresholdValue (manual) | NA |
| BpThreshold (abs/cm2) value | 0 | ePTFE Membranes ePTFE Membrane 1—Preparation ePTFE Membrane

An ePTFE membrane was manufactured according to the general teachings set forth in U.S. Patent Publication No. 2004/0173978 to Bowen et al. The ePTFE membrane had a mass-per-area of 4.6 g/m$^2$, a porosity of 87%, a non-contact thickness of 15.5 µm, a Gurley number of 4.5 seconds, an ATEQ air flow of 17 liters/cm$^2$/hour at 12 mbar, a matrix tensile strength of 258 MPa in the machine direction, a matrix tensile strength of 329 MPa in the transverse direction, a specific surface area of 14.520 m$^2$/g, and a surface area per volume of 31.944 m$^2$/cm$^3$. A scanning electron microscope (SEM) image of the ePTFE membrane is shown in FIG. 1.

ePTFE Membrane 2—Preparation ePTFE Membrane

Figure 2:
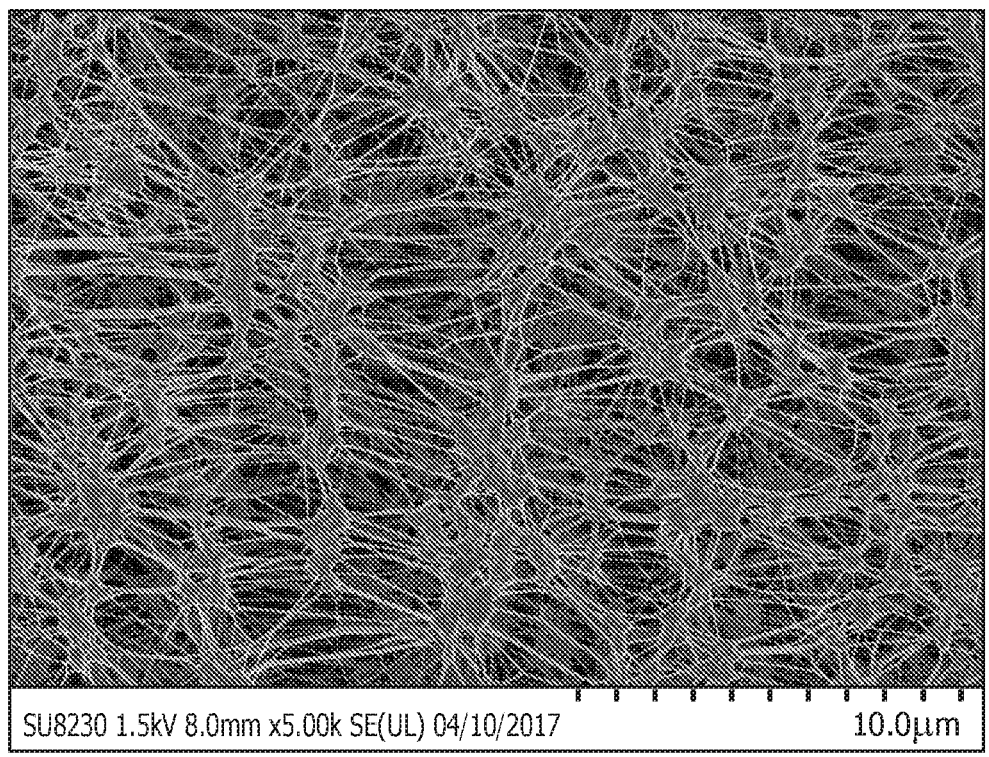
FIG. 2 is an SEM of a porous expanded PTFE membrane (Membrane 2) according to at least one embodiment.

An ePTFE membrane was manufactured according to the general teachings set forth in U.S. Pat. No. 3,953,566 to Gore. The ePTFE membrane had a mass-per-area of 16.6 g/m$^2$, a porosity of 80%, a non-contact thickness of 37.6 µm, a bubble point of 156 kPa, a matrix tensile strength of 42.4 MPa in the machine direction, a matrix tensile strength of 116.4 MPa in the transverse direction, a specific surface area of 7.891 m$^2$/g and a surface area per volume of 17.75 m$^2$/cm$^3$. An SEM image of the ePTFE membrane is shown in FIG. 2.

EXAMPLES

The invention of this application has been described above both generically and with regard to specific embodiments. It will be apparent to those skilled in the art that various modifications and variations can be made in the embodiments without departing from the scope of the disclosure. Thus, it is intended that the embodiments cover the modifications and variations of this invention provided they come within the scope of the appended claims and their equivalents.

Example 1

Expanded polytetrafluoroethylene (ePTFE) (Membrane 1) was used as the substrate for imbibing. The ePTFE membrane was restrained by laying it over a 6-inch (~15.24 cm) diameter aluminum hoop, fixing it to the hoop by placing a stainless steel spring around the circumference, and tensioning the substrate by hand to remove wrinkles. To support the ePTFE membrane during adhesion of the stencil, the hoop restraining the ePTFE membrane was placed over a clean DELRIN® disc (an acetal homopolymer resin available from DowDuPont, Wilmington, Del.) that was machined to fit inside the hoop (the disc provided a clean surface that contacted the "bottom" of the ePTFE substrate).

To prepare the stencil, a piece of tape (Scapa Type 536; a polyester film, single coated with an acrylic adhesive; Scapa North America, Windsor, Conn.) was transferred to release paper. A laser cutter (PLS6.75 laser cutter, Universal Laser, Scottsdale, Ariz.) was used to cut holes into the tape to form the pattern depicted in FIG. 4. The dimensions provided in FIG. 4 are in millimeters (mm) and indicate the size of the pattern applied. The double-ended arrow 402 is shown to illustrate the alignment of the stretch textile with the flexible circuit. The tape stencil was then removed from the release paper and pressed by hand to the surface of the exposed "top" surface of the ePTFE membrane to firmly adhere the stencil to the ePTFE membrane. The stencil and the ePTFE membrane, still restrained on the hoop, were then removed from the DELRIN® disc and placed in a laboratory fume hood for imbibing.

Conductive Ink Imbibing

An excess of conductive ink (2108-IPA; an ink formulation including stably dispersed silver nanoparticles, available from Nanogap Inc., Richmond, Calif.) was pipetted onto the top surface of the ePTFE membrane through the holes in the stencil. When this process was complete, the top surface was thoroughly wiped with a single ply cellulose wipe (Delicate Task Wiper; KIMWIPES®; Kimberly-Clark, Roswell, Ga.) to remove any excess ink. The tape stencil was then promptly removed. Removal of the stencil also removed a portion of the upper surface of the substrate that was adhered to the stencil, but the amount removed was considered negligible. The imbibed ePTFE membrane, still restrained in the hoop, was then allowed to air dry in the hood for at least 10 minutes, and then heat-treated in a hot air convection oven for 60 minutes at 200° C.

Bonding Adhesive Dots to a Stretch Textile

UT polyurethane thermoplastic adhesive (Protechnic, Cernay France) was printed onto release paper using an 18Q236 gravure pattern. A nylon/polyester/elastane blend, twill weave, warp direction stretch textile (TD36B, Formosa Chemicals and Fibre Corporation, Taipei, Taiwan) was stretched in the warp direction to about 2 times its relaxed length and restrained in a rectangular frame. A 112 mm×152 mm sheet of the polyurethane adhesive printed release paper was positioned on the textile and heat laminated to the textile by pressing it in a T-shirt press at 135° C. for approximately 5 seconds. Once cooled, the release paper was removed, leaving the polyurethane adhesive dots bonded to the stretch textile.

Preparation of Structured ("Buckled") Laminate

The ePTFE membrane with the imbibed conductive trace (i.e., the printed circuit) was trimmed to 128 mm×78 mm with the printed pattern approximately centered. The printed circuit was then centered on top of the adhesive dots that were bonded to the textile, aligning arrow 402 in FIG. 4 with the warp direction of the textile. The printed circuit was then heat laminated to the textile by pressing it in a T-shirt press at 135° C. for approximately 5 seconds. After cooling, the textile was released from the frame and allowed to return to its relaxed state thereby compressing and buckling the printed circuit with the textile (conductive article).

Resistance Measurement v. Stretch

Figure 5:
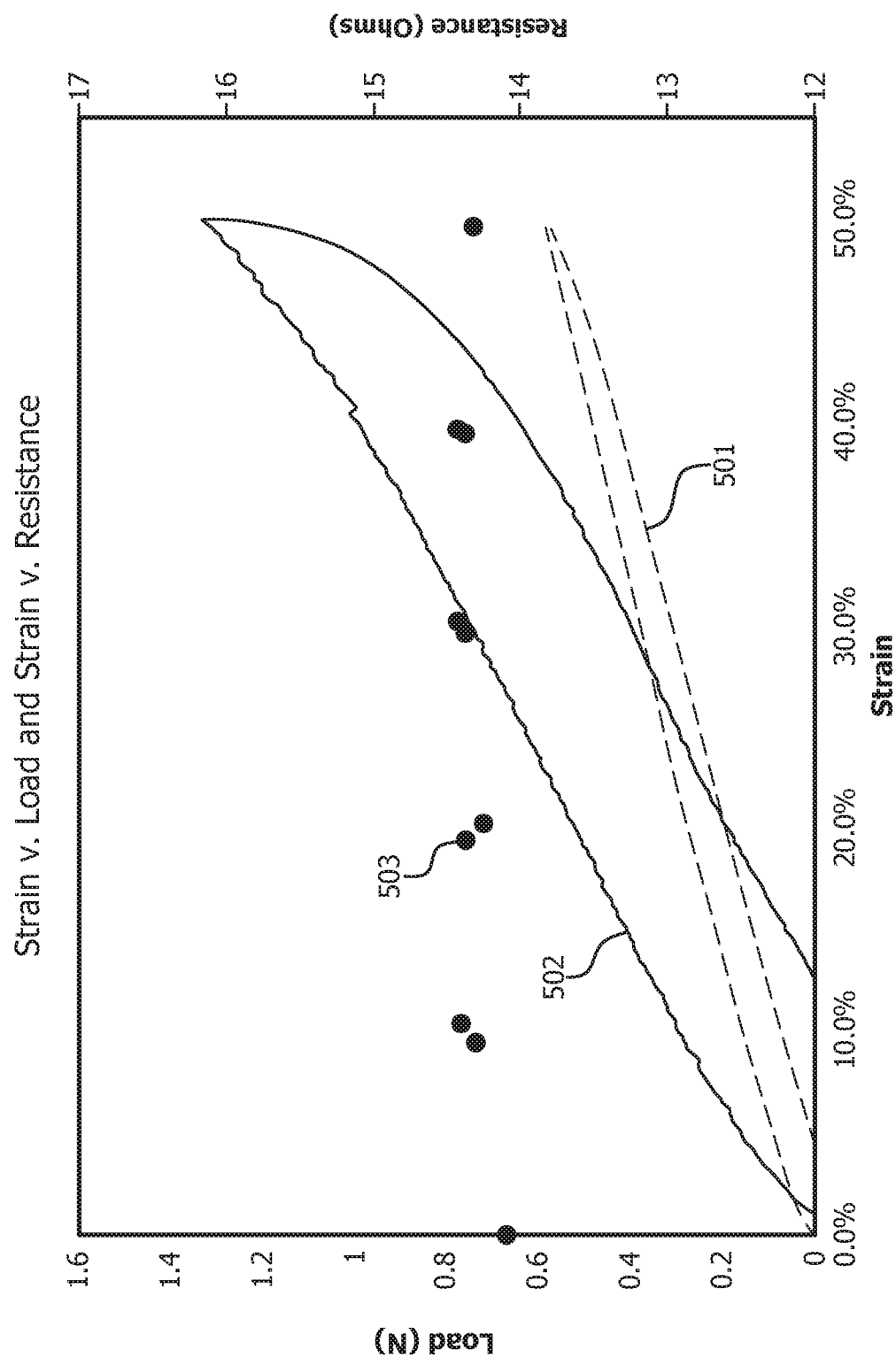
FIG. 5 is a graphical illustration of the strain v. load and strain v. resistance for several materials tested in Example 1 according to at least one embodiment.

Resistance Measurement v. Stretch testing was performed as described in the test method set forth above. The results of this resistance testing are presented in FIG. 5 and Table 1. Discontinuous curve 501 shows the load-strain relationship of the unlaminated textile, while continuous curve 502 shows the load-strain relationship of the flexible article as each sample was stretched to 50% strain and returned to 0% strain. Both are read on the primary y-axis. Circular markers 503 show the resistance in ohms of the conductive trace of the laminated sample with respect to strain, and is read on the secondary y-axis. It was determined that the resistance of the printed circuit remained substantially unchanged as the flexible circuit was elongated to 50% strain.

Wash Testing

Wash testing durability was performed as described in the test method set forth above. It was determined that the printed circuit survived more than 20 wash cycles before 50% of the traces exceeded 1 Megaohm (MO).

MTVR

The moisture vapor transmission rate was measured as described in the test method set forth above. The MVTR was measured to be 16114 g/m$^2$/24 hours (Table 1).

Kawabata Testing

Kawabata bend testing was performed as described in the test method set forth above. The Kawabata bend test value was measured as 0.0418 grams force-cm$^2$/cm.

Example 2

Expanded polytetrafluoroethylene (ePTFE) (Membrane 1) was used as the substrate for printing. The ePTFE membrane was restrained in a 356 mm diameter embroidery hoop, tensioned to remove wrinkles, and screen-printed using conductive ink in the pattern shown in FIG. 4. The dimensions shown in FIG. 4 are in mm and indicate the size of the pattern applied. The double ended arrow 402 is shown to illustrate the alignment of the substrate with the flexible circuit. The screen printing was performed using a model MSP-088 screen printer (HMI Manufacturing, Lebanon, N.J.) and a stainless steel screen with 200 TPI (threads/wire per inch; ~78.74 wires per cm), 1.6 mil (~40.64 µm) wire diameter, and a 12.7 µm emulsion. The conductive ink used was CI1036 (a highly conductive silver ink; total solids content 66%; Engineered Conductive Materials, Delaware, Ohio). The ink was dried in a convection oven at 120° C. for 20 minutes. The printed circuit was removed from the embroidery hoop by trimming the substrate to 128 mm×78 mm with the printed pattern approximately centered on the ePTFE membrane.

The process of bonding polyurethane adhesive dots to a stretch textile followed the process described in Example 1. The stretch textile was the same as that used in Example 1.

Preparation of a structured ("buckled") ePTFE laminate followed the process described in Example 1 to adhere the printed circuit to the stretch textile (e.g., conductive article).

Resistance Measurement v. Stretch

Resistance Measurement v. Stretch testing was performed as described in the test method set forth above. The resistance of the circuit remained substantially unchanged as the flexible circuit was elongated to 50% strain.

Wash Testing

Wash testing durability was performed as described in the test method set forth above. It was determined that the printed circuit survived more than 3 wash cycles before 50% of the traces exceeded 1 Megaohm (MΩ) (Table 1).

MTVR

The moisture vapor transmission rate of the flexible circuit was measured as described in the test method set forth above. The MVTR was measured to be 16085 g/m$^2$/24 hours (Table 1).

Kawabata Testing

Kawabata bend testing was performed as described in the test method set forth above. The Kawabata bend test value was measured as 0.0364 grams force-cm$^2$/cm.

Example 3

Expanded polytetrafluoroethylene (ePTFE) (Membrane 2) was used as the substrate for printing. The ePTFE membrane was restrained in a 356 mm diameter embroidery hoop, tensioned to remove wrinkles, and screen-printed using conductive ink in the pattern shown in FIG. 4. The dimensions shown in FIG. 4 are in mm and shown for reference and indicate the size of the pattern applied. The double ended arrow 402 is shown to illustrate the alignment of the substrate with the flexible circuit. The screen printing was performed using a model MSP-088 screen printer (HMI Manufacturing, Lebanon, N.J.) and a stainless steel screen with 200 TPI (threads/wire per inch; ~78.74 wires per cm), 1.6 mil (~40.64 µm) wire diameter, and a 12.7 µm emulsion. The conductive ink used was CI1036 (a highly conductive silver ink; total solids content 66%; Engineered Conductive Materials, Delaware, Ohio). The ink was dried in a convection oven at 120° C. for 20 minutes. The printed ePTFE membrane was removed from the embroidery hoop by trimming the substrate to 128 mm×78 mm with the printed pattern approximately centered on the ePTFE membrane.

The process of bonding adhesive dots to a stretch textile followed the process described in Example 1. The textile was the same as that used in Example 1.

Preparation of a structured ("buckled") ePTFE laminate followed the process described in Example 1 to adhere the flexible circuit to the stretch textile.

Resistance Measurement v. Stretch

Resistance Measurement v. Stretch testing was performed as described in the test method set forth above. The resistance of the circuit remained substantially unchanged as the flexible circuit was elongated to 50% strain.

Wash Testing

Wash testing durability was performed as described in the test method set forth above. It was determined that the printed circuit survived more than 3 wash cycles before 50% of the traces exceeded 1 Megaohm (MO) (Table 1).

MTVR

The moisture vapor transmission rate of the flexible circuit was measured as described in the test method set forth above. The MVTR was measured to be 14263 g/m$^2$/24 hours (Table 1).

Kawabata Testing

Kawabata bend testing was performed as described in the test method set forth above. The Kawabata bend test value was measured as 0.0348 grams force-cm$^2$/cm.

Example 4

A commercially available 25 µm thick thermoplastic polyurethane film (TPU), DUREFLEX® PT1710S, (Covestro LLC, Whately, Mass.) was obtained. The TPU film was restrained in a 356-mm diameter embroidery hoop, tensioned to remove wrinkles, and screen-printed using conductive ink in the pattern depicted in FIG. 4. The dimensions shown in FIG. 4 are in mm and shown for reference and indicate the size of the pattern applied. The double ended arrow 402 is shown to illustrate the alignment of the substrate with the flexible circuit.

The screen printing was performed using a model MSP-088 screen printer (HMI Manufacturing, Lebanon, N.J.) and a stainless steel screen with 200 TPI (threads/wire per inch; ~78.74 wires per cm), 1.6 mil (~40.64 µm) wire diameter, and a 12.7 µm emulsion. The conductive ink used was CI1036 (a highly conductive silver ink; total solids content 66%; Engineered Conductive Materials, Delaware, Ohio). The ink was dried in a convection oven at 120° C. for 20 minutes. The printed substrate was removed from the embroidery hoop by trimming the substrate to 128 mm×78 mm with the printed pattern approximately centered in the PTU film.

The process of bonding adhesive dots to a stretch textile followed the process described in Example 1. The textile was the same as that of Example 1.

Preparation of structured ("buckled") laminate followed the process described in Example 1 to adhere the flexible circuit to the stretch textile.

Resistance Measurement v. Stretch

Resistance Measurement v. Stretch testing was performed as described in the test method set forth above. The resistance of the circuit remained substantially unchanged as the flexible circuit was elongated to 50% strain.

Wash Testing

Wash testing durability was performed as described in the test method set forth above. It was determined that the printed circuit survived 1 wash cycle before 50% of the traces exceeded 1 Megaohm (MO) (Table 1).

MTVR

The moisture vapor transmission rate of the flexible circuit was measured as described in the test method set forth above. The MVTR was measured to be 2459 $g/m^2/24$ hours (Table 1).

Kawabata Testing

Kawabata bend testing was performed as described in the test method set forth above. The Kawabata bend test value was measured as 0.0527 grams force-$cm^2$/cm.

Example 5

Figure 3:
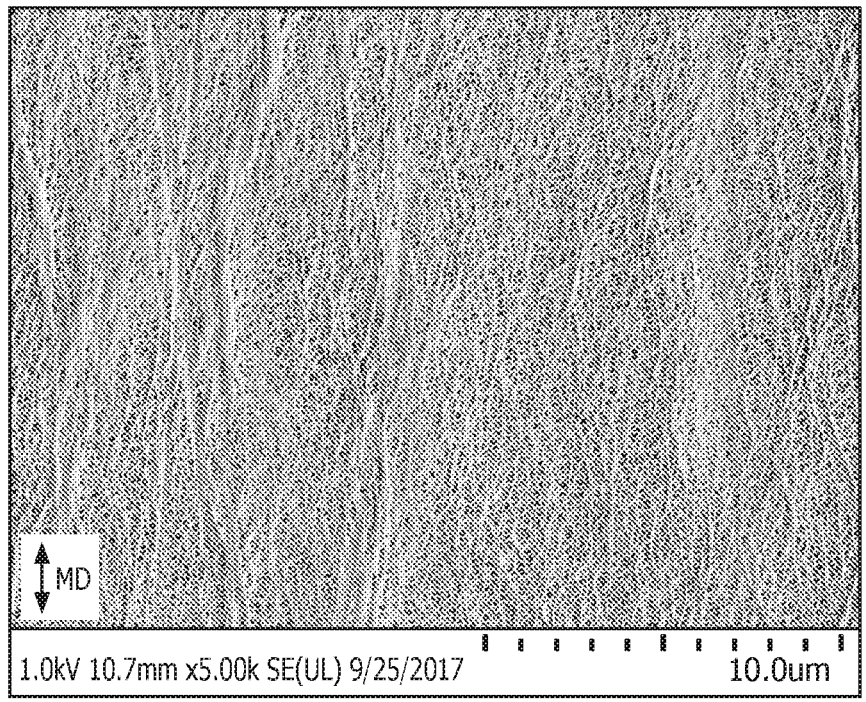
FIG. 3 is an SEM of a porous polyethylene membrane utilized in Example 5 according to at least one embodiment.

A 12 µm thick porous polyethylene lithium ion battery separator, (T3, Pair Materials Co. Ltd, Dongguan, China) was obtained. The polyethylene membrane had a mass-per-area of 7.0 $g/m^2$, a porosity of 40%, a thickness of 12.4 µm, a bubble point of 1543 kPa, a matrix tensile strength of 314 MPa in the machine direction, a matrix tensile strength of 233 MPa in the transverse direction, a specific surface area of 34.1 $m^2/g$ and a surface area per volume of 32.1 $m^2/cm^3$. An SEM image of the polyethylene membrane is shown in FIG. 3.

The polyethylene film was restrained in a 356-mm diameter embroidery hoop, tensioned to remove wrinkles, and screen-printed using conductive ink in the pattern shown in FIG. 4. The dimensions shown in FIG. 4 are in mm and shown for reference and indicate the size of the pattern applied. The double ended arrow 402 in FIG. 4 is shown to illustrate the alignment of the substrate with the printed circuit. Screen printing was performed using a model MSP-088 screen printer (HMI Manufacturing, Lebanon, N.J.) and a stainless steel screen with 200 TPI (threads/wire per inch; ~78.74 wires per cm), 1.6 mil (40.64 µm) wire diameter, 12.7 µm emulsion. The conductive ink used was CI1036 (a highly conductive silver ink; total solids content 66%; Engineered Conductive Materials, Delaware, Ohio). The ink was dried in a convection oven at 120° C. for 20 minutes. The printed polyethylene film was removed from the embroidery hoop by trimming the polyethylene film to 128 mm×78 mm with the printed pattern approximately centered in the polyethylene film (printed circuit).

The process of bonding adhesive dots to a stretch textile followed the process described in Example 1. The textile was the same as that used in Example 1.

Preparation of structured ("buckled") laminate followed the process described in Example 1 to adhere the flexible circuit to the stretch textile.

Resistance Measurement v. Stretch

Resistance Measurement v. Stretch testing was performed as described in the test method set forth above. The resistance of the circuit remained substantially unchanged as the flexible circuit was elongated to 50% strain.

Wash Testing

Wash testing durability was performed as described in the test method set forth above. It was determined that the printed circuit survived 3 wash cycles before 50% of the traces exceeded 1 Megaohm (MO) (Table 1).

MTVR

The moisture vapor transmission rate of the flexible circuit was measured as described in the test method set forth above. The MVTR was measured to be 9721 $g/m^2/24$ hours (Table 1).

Kawabata Testing

Kawabata bend testing was performed as described in the test method set forth above. The Kawabata bend test value was measured as 0.0970 grams force-$cm^2$/cm.

Example 6

Expanded polytetrafluoroethylene (ePTFE) membrane (Membrane 1) was used as the substrate. To prepare the ePTFE membrane for imbibing, the ePTFE membrane was restrained by laying it over a 6-inch diameter aluminum hoop, fixing it to the hoop by placing a stainless steel spring around the circumference, and tensioning the ePTFE membrane to remove wrinkles. To support the ePTFE membrane during adhesion of the stencil, the hoop restraining the ePTFE membrane was placed over a clean DELRIN® (an acetal homopolymer resin available from DowDuPont, Wilmington, Del.) disc that was machined to fit inside the hoop, and which provided a clean surface that contacted the "bottom" of the ePTFE membrane. To prepare the stencil, a piece of tape (Scapa Type 536; a polyester film, single coated with an acrylic adhesive; Scapa North America, Windsor, Conn.) was transferred to release paper, and a laser cutter (PLS6.75 laser cutter, Universal Laser, Scottsdale, Ariz.) was used to cut holes in the tape stencil in the pattern shown in FIG. 4. The dimensions shown in FIG. 4 are in mm and are shown to indicate the size of the pattern.

The tape stencil was then removed from the release paper and pressed by hand to the surface of the exposed "top" surface of the ePTFE membrane to firmly adhere it to the ePTFE membrane. The stencil and ePTFE membrane, still restrained on the hoop, were then removed from the DELRIN® disc and placed in a laboratory fume hood for imbibing. An excess of conductive ink (2108-IPA available from Nanogap, Inc.) was pipetted onto the top surface of the ePTFE membrane through the holes in the tape stencil. When this process was complete, the top surface of the stencil/ePTFE membrane was thoroughly wiped with a Kimwipe (Kimberly Clark, Delicate Task Wiper, 1-ply) to remove any excess ink. The tape stencil was then promptly removed. Removal of the stencil also removed a portion of the upper surface of the ePTFE membrane that was adhered to the stencil, but the amount was considered negligible. The imbibed ePTFE membrane (printed circuit), still restrained in the hoop, was then allowed to air dry in the hood for at least 10 minutes, and then heat-treated in a hot air convection oven for 60 minutes at 200° C.

UT polyurethane thermoplastic adhesive (Protechnic, Cernay France) was printed onto release paper using a 18Q236 gravure pattern. A nylon/polyester/elastane blend, twill weave, warp direction stretch textile (TD36B, Formosa Chemicals and Fibre Corporation, Taipei, Taiwan) was restrained in a rectangular frame with the fabric in a non-stretched (relaxed) state. A 112 mm×152 mm sheet of adhesive printed release paper was positioned on the textile and heat laminated to the textile by pressing the release paper and textile in a T-shirt press at 135° C. for approximately 5 seconds. Once cooled, the release paper was removed, leaving adhesive dots bonded to the textile. To adhere the printed circuit to the textile, the printed circuit was first trimmed to 128 mm×78 mm with the printed pattern approximately centered on the adhesive dots bonded to the textile, aligning arrow 402 in FIG. 4 with the warp direction of the textile. The printed circuit was then heat laminated to the textile by pressing the textile containing the printed circuit in a T-shirt press at 135° C. for approximately 5 seconds. After cooling, the textile was released from the frame.

Resistance Measurement v. Stretch

Resistance Measurement v. Stretch testing was performed as described in the test method set forth above. The resistance of the printed circuit increased significantly as the flexible circuit was elongated to 50% strain.

Wash Testing

Wash testing durability was performed as described in the test method set forth above. It was determined that the sample survived 6 wash cycles before 50% of the traces exceeded 1 Megaohm (MΩ) (Table 1).

MTVR

The moisture vapor transmission rate of the flexible circuit was measured as described in the test method set forth above. The MVTR was measured to be 17127 g/m$^2$/24 hours (Table 1).

Kawabata Testing

Kawabata bend testing was performed as described in the test method set forth above. The Kawabata bend test value was measured as 0.0669 grams force-cm$^2$/cm.

Example 7

Expanded polytetrafluoroethylene (ePTFE) membrane (Membrane 1) was used as the substrate. The ePTFE membrane was restrained in a 356 mm diameter embroidery hoop, tensioned to remove wrinkles, and screen-printed using conductive ink in the pattern shown in FIG. 4. The dimensions shown in FIG. 4 are in mm and shown for reference and indicate the size of the pattern applied. Screen printing was performed using a model MSP-088 screen printer (HMI Manufacturing, Lebanon, N.J.) and a stainless steel screen with 200 TPI (threads/wire per inch; ~78.74 wires per cm), 1.6 mil (~40.64 μm) wire diameter, and a 12.7 μm emulsion. The conductive ink used was CI1036 (a highly conductive silver ink; total solids content 66%; Engineered Conductive Materials, Delaware, Ohio). The ink was dried in a convection oven at 120° C. for 20 minutes. The printed ePTFE membrane was removed from the embroidery hoop by trimming the ePTFE membrane to 128 mm×78 mm with the printed pattern approximately centered on the ePTFE membrane.

UT polyurethane thermoplastic adhesive (Protechnic, Cernay France) was printed onto release paper using a 18Q236 gravure pattern. A nylon/polyester/elastane blend, twill weave, warp direction stretch textile (TD36B, Formosa Chemicals and Fibre Corporation, Taipei, Taiwan) was restrained in a rectangular frame with the fabric in a non-stretched (relaxed) state. A 112 mm×152 mm sheet of adhesive printed release paper was positioned on the textile and heat laminated to the textile by pressing the release paper and textile in a T-shirt press at 135° C. for approximately 5 seconds. Once cooled, the release paper was removed, leaving adhesive dots bonded to the textile. To adhere the printed circuit to the textile, the printed circuit was first trimmed to 128 mm×78 mm with the printed pattern approximately centered on the adhesive dots bonded to the textile, aligning arrow 402 in FIG. 4 with the warp direction of the textile. The printed circuit was then heat laminated to the textile by pressing the textile containing the printed circuit in a T-shirt press at 135° C. for approximately 5 seconds. After cooling, the textile was released from the frame.

Resistance Measurement v. Stretch

Resistance Measurement v. Stretch testing was performed as described in the test method set forth above. It was determined that the resistance of the circuit increased significantly as the flexible circuit was elongated to 50% strain.

Wash Testing

Wash testing durability was performed as described in the test method set forth above. It was determined that the sample survived 1 wash cycle before 50% of the traces exceeded 1 Megaohm (MΩ) (Table 1).

MTVR

The moisture vapor transmission rate of the flexible circuit was measured as described in the test method set forth above. The MVTR was measured to be 16259 g/m$^2$/24 hours (Table 1).

Kawabata Testing

Kawabata bend testing was performed on the flexible circuit as described in the test method set forth above. The Kawabata bend test value was measured as 0.0544 grams force-cm$^2$/cm.

Example 8

A commercially available 25 μm thick thermoplastic polyurethane film (TPU), DUREFLEX® PT1710S, (Covestro LLC, Whately, Mass.) was obtained. The TPU film was restrained in a 356-mm diameter embroidery hoop, tensioned to remove wrinkles, and screen-printed using conductive ink in the pattern shown in FIG. 4. The dimensions shown in FIG. 4 are in mm and indicate the size of the pattern applied. The double ended arrow 402 is shown to illustrate the alignment of the substrate with the flexible circuit.

Screen printing was performed using a model MSP-088 screen printer (HMI Manufacturing, Lebanon, N.J.) and a stainless steel screen with 200 TPI (threads/wire per inch; ~78.74 wires per cm), 1.6 mil (~40.64 μm) wire diameter, and a 12.7 μm emulsion. The conductive ink used was CI1036 (a highly conductive silver ink; total solids content 66%; Engineered Conductive Materials, Delaware, Ohio). The ink was dried in a convection oven at 120° C. for 20 minutes. The printed TPU film was removed from the embroidery hoop by trimming the substrate to 128 mm×78 mm with the printed pattern approximately centered.

UT polyurethane thermoplastic adhesive (Protechnic, Cernay France) was printed onto release paper using a 18Q236 gravure pattern. A nylon/polyester/elastane blend, twill weave, warp direction stretch textile (TD36B, Formosa Chemicals and Fibre Corporation, Taipei, Taiwan) was restrained in a rectangular frame with the fabric in a non-stretched (relaxed) state. A 112 mm×152 mm sheet of adhesive printed release paper was positioned on the textile and heat laminated to the textile by pressing the release paper and textile in a T-shirt press at 135° C. for approximately 5 seconds. Once cooled, the release paper was removed, leaving adhesive dots bonded to the textile. To adhere the printed circuit to the textile, the printed circuit was first trimmed to 128 mm×78 mm with the printed pattern approximately centered on the adhesive dots bonded to the textile, aligning arrow 402 in FIG. 4 with the warp direction of the textile. The printed circuit was then heat laminated to the textile by pressing the textile containing the printed circuit in a T-shirt press at 135° C. for approximately 5 seconds. After cooling, the textile was released from the frame.

Resistance Measurement v. Stretch

Resistance Measurement v. Stretch testing was performed as described in the test method set forth above. It was determined that the resistance of the printed circuit increased significantly as the laminate was elongated to 50% strain.

Wash Testing

Wash testing durability was performed as described in the test method set forth above. The printed circuit survived 1 wash cycle before 50% of the traces exceeded 1 Megaohm (MΩ) (Table 1).

MTVR

The moisture vapor transmission rate of the flexible circuit was measured as described in the test method set forth above. The MVTR was measured to be 1852 g/m$^2$/24 hours (Table 1).

Kawabata Testing

Kawabata bend testing of the flexible circuit was performed as described in the test method set forth above. The Kawabata bend test value was measured as 0.0710 grams force-cm$^2$/cm.

Example 9

Expanded polytetrafluoroethylene (ePTFE) (Membrane 1) was used as the substrate. To prepare the ePTFE membrane for imbibing, the ePTFE membrane was restrained by laying it over a 6-inch diameter aluminum hoop, fixing it to the hoop by placing a stainless steel spring around the circumference, and tensioning the ePTFE membrane to remove wrinkles. To support the ePTFE membrane during adhesion of the stencil, the hoop restraining the ePTFE membrane was placed over a clean DELRIN® (an acetal homopolymer resin available from DowDuPont, Wilmington, Del.) disc that was machined to fit inside the hoop, and which provided a clean surface that contacted the "bottom" of the ePTFE membrane. To prepare the stencil, a piece of tape (Scapa Type 536; a polyester film, single coated with an acrylic adhesive; Scapa North America, Windsor, Conn.) was transferred to release paper, and a laser cutter (PLS6.75 laser cutter, Universal Laser, Scottsdale, Ariz.) was used to cut holes in the tape stencil in the pattern shown in FIG. 4. The dimensions shown in FIG. 4 are in mm and are shown to indicate the size of the pattern.

The tape stencil was then removed from the release paper and pressed by hand to the surface of the exposed "top" surface of the ePTFE membrane to firmly adhere it to the ePTFE membrane. The stencil and ePTFE membrane, still restrained on the hoop, were then removed from the DELRIN® disc and placed in a laboratory fume hood for imbibing. An excess of conductive ink (2108-IPA available from Nanogap, Inc.) was pipetted onto the top surface of the ePTFE membrane through the holes in the tape stencil. When this process was complete, the top surface of the stencil/ePTFE membrane was thoroughly wiped with a Kimwipe (Kimberly Clark, Delicate Task Wiper, 1-ply) to remove any excess ink. The tape stencil was then promptly removed. Removal of the stencil also removed a portion of the upper surface of the ePTFE membrane that was adhered to the stencil, but the amount was considered negligible. The imbibed ePTFE membrane, still restrained in the hoop, was then allowed to air dry in the hood for at least 10 minutes, and then heat-treated in a hot air convection oven for 60 minutes at 200° C.

An array of adhesive dots on a release liner was prepared from an acrylic pressure sensitive adhesive (ARCARE® 7396, Adhesives Research, Glen Rock, Pa.). The pressure sensitive adhesive on the release liner was laser cut into an array of dots using a PLS6.75 laser cutter (Universal Laser, Scottsdale, Ariz.) at a power setting of 20 percent and a speed of 100 percent. This setting allowed for the complete cutting of the adhesive, without cutting through the release liner. A square array of 1 mm diameter dots on 2 mm centers was created once the waste material was removed and discarded, leaving an array of adhesive dots supported on release liner.

A 25 μm thick thermoplastic polyurethane film (TPU), DUREFLEX® PT1710S, (Covestro LLC, Whately, Mass.) was stretched and held at 2 times its relaxed state. The urethane film was plasma treated using a PT2000P plasma treater with a 6.35 mm nozzle (Tri Star Technologies, El Segunda, Calif.) by passing the plasma wand over the film in a raster pattern, covering the approximately 150 mm×200 mm area in about 20 seconds. The array of adhesive dots was pressed by hand onto the urethane film. The release liner was then removed and discarded.

To adhere the printed circuit to the urethane film, the ePTFE membrane was first trimmed to 128 mm×78 mm with the printed pattern approximately centered on the ePTFE membrane (printed circuit). The printed circuit was centered on top of the adhesive dots that were bonded to the urethane film, aligning arrow 402 in FIG. 4 with the stretched direction of the urethane film. The printed circuit was then pressed by hand onto the urethane film, creating a bond. The urethane was then released and allowed to return to its relaxed state, in the process, compressing and buckling the printed circuit with the urethane.

Resistance Measurement v. Stretch

Resistance Measurement v. Stretch testing was performed as described in the test method set forth above. The resistance of the printed circuit remained substantially unchanged as the flexible circuit was elongated to 50% strain.

Wash Testing

Wash testing durability was not performed.

MTVR

The moisture vapor transmission rate of the flexible circuit was measured as described in the test method set forth above. The MVTR was measured to be 7522 g/m$^2$/24 hours (Table 1).

Kawabata Testing

Kawabata bending testing of the flexible circuit was performed as described in the test method set forth above. The Kawabata bend test value was measured as 0.0356 grams force-cm$^2$/cm.

Example 10

Expanded polytetrafluoroethylene (ePTFE) (Membrane 1) was used as the substrate. Printing the circuit on the surface of the ePTFE membrane followed the process described in Example 2. The lamination process and the buckling process using a urethane substrate followed the steps described in Example 9.

Resistance Measurement v. Stretch

Resistance Measurement v. Stretch testing was performed as described in the test method set forth above. It was determined that the resistance of the printed circuit remained substantially unchanged as the flexible circuit was elongated to 50% strain.

Wash Testing

Wash testing durability was not performed.

MTVR

The moisture vapor transmission rate of the flexible circuit was measured as described in the test method set forth above. The MVTR was measured to be 6972 g/m$^2$/24 hours (Table 1).

Kawabata Testing

Kawabata bending testing of the flexible circuit was performed as described in the test method set forth above. The Kawabata bend test value was measured as 0.0342 grams force-cm$^2$/cm.

Example 11

Expanded polytetrafluoroethylene (ePTFE) (Membrane 1) was used as substrate. To prepare the ePTFE membrane for imbibing, the ePTFE membrane was restrained by laying it over a 6-inch diameter aluminum hoop, fixing it to the hoop by placing a stainless steel spring around the circumference, and tensioning the ePTFE membrane to remove wrinkles. To support the ePTFE membrane during adhesion of the stencil, the hoop restraining the ePTFE membrane was placed over a clean DELRIN® (an acetal homopolymer resin available from DowDuPont, Wilmington, Del.) disc that was machined to fit inside the hoop, and which provided a clean surface that contacted the "bottom" of the ePTFE membrane. To prepare the stencil, a piece of tape (Scapa Type 536; a polyester film, single coated with an acrylic adhesive; Scapa North America, Windsor, Conn.) was transferred to release paper, and a laser cutter (PLS6.75 laser cutter, Universal Laser, Scottsdale, Ariz.) was used to cut holes in the tape stencil in the pattern shown in FIG. 4. The dimensions shown in FIG. 4 are in mm and are shown to indicate the size of the pattern.

The tape stencil was then removed from the release paper and pressed by hand to the surface of the exposed "top" surface of the ePTFE membrane to firmly adhere it to the ePTFE membrane. The stencil and ePTFE membrane, still restrained on the hoop, were then removed from the DELRIN® disc and placed in a laboratory fume hood for imbibing. An excess of conductive ink (2108-IPA available from Nanogap, Inc.) was pipetted onto the top surface of the ePTFE membrane through the holes in the tape stencil. When this process was complete, the top surface of the stencil/ePTFE membrane was thoroughly wiped with a Kimwipe (Kimberly Clark, Delicate Task Wiper, 1-ply) to remove any excess ink. The tape stencil was then promptly removed. Removal of the stencil also removed a portion of the upper surface of the ePTFE membrane that was adhered to the stencil, but the amount was considered negligible. The imbibed ePTFE membrane (printed circuit), still restrained in the hoop, was then allowed to air dry in the hood for at least 10 minutes, and then heat-treated in a hot air convection oven for 60 minutes at 200° C.

UT polyurethane thermoplastic adhesive (Protechnic, Cernay France) was printed onto release paper using a 18Q236 gravure pattern. A 91 g/m$^2$ non-stretch, nylon woven material (Style 131859, (MI 270) from Milliken and Company, Spartanburg, S.C.) was restrained in a rectangular frame with just enough tension to remove any wrinkles. A 112 mm×152 mm sheet of adhesive printed release paper was positioned on the textile and heat laminated to the textile by pressing the textile and release paper in a T-shirt press at 135° C. for approximately 5 seconds. Once cooled, the release paper was removed, leaving the adhesive dots bonded to the textile. To adhere the printed circuit to the textile, the ePTFE membrane was first trimmed to 128 mm×78 mm with the printed pattern approximately centered. The printed circuit was centered on top of the adhesive dots that were bonded to the textile, aligning arrow 402 in FIG. 4 with the warp direction of the textile. The printed circuit was then heat laminated to the textile by pressing it in a T-shirt press at 135° C. for approximately 5 seconds. After cooling, the textile was released from the frame.

Resistance Measurement v. Stretch

Resistance Measurement v. Stretch testing was performed as described in the test method set forth above. The resistance of the circuit increased significantly as the flexible circuit was elongated to 50% strain.

Wash Testing

Wash testing durability was performed as described in the test method set forth above. It was determined that the sample survived 10 wash cycles before 50% of the traces exceeded 1 Megaohm (MO) (Table 1).

MTVR

The moisture vapor transmission rate of the flexible circuit was measured as described in the test method set forth above. The MVTR was measured to be 21119 g/m$^2$/24 hours (Table 1).

Kawabata Testing

Kawabata bending testing of the flexible circuit was performed as described in the test method set forth above. The Kawabata bend test value was measured as 0.0607 grams force-cm$^2$/cm.

Example 12

Expanded polytetrafluoroethylene (ePTFE) (Membrane 1) was used as the substrate. The ePTFE membrane was restrained in a 356 mm diameter embroidery hoop, tensioned to remove wrinkles, and screen-printed using conductive ink in the pattern shown in FIG. 4. The dimensions shown in FIG. 4 are in mm and indicate the size of the pattern applied. The double ended arrow 402 is shown to illustrate the alignment of the substrate with the flexible circuit. The screen printing was performed using a model MSP-088 screen printer (HMI Manufacturing, Lebanon, N.J.) and a stainless steel screen with 200 TPI (threads/wire per inch; ~78.74 wires per cm), 1.6 mil (~40.64 μm) wire diameter, and a 12.7 μm emulsion. The conductive ink used was CI1036 (a highly conductive silver ink; total solids content 66%; Engineered Conductive Materials, Delaware, Ohio). The ink was dried in a convection oven at 120° C. for 20 minutes. The printed substrate was removed from the embroidery hoop by trimming the substrate to 128 mm×78 mm with the printed pattern approximately centered on the ePTFE membrane.

UT polyurethane thermoplastic adhesive (Protechnic, Cernay France) was printed onto release paper using a 18Q236 gravure pattern. A 91 g/m² non-stretch, nylon woven material (Style 131859, (MI 270) from Milliken and Company, Spartanburg, S.C.) was restrained in a rectangular frame with just enough tension to remove any wrinkles. A 112 mm×152 mm sheet of adhesive printed release paper was positioned on the textile and heat laminated to the textile by pressing the textile and release paper in a T-shirt press at 135° C. for approximately 5 seconds. Once cooled, the release paper was removed, leaving the adhesive dots bonded to the textile. To adhere the printed circuit to the textile, the ePTFE membrane was first trimmed to 128 mm×78 mm with the printed pattern approximately centered. The printed circuit was centered on top of the adhesive dots that were bonded to the textile, aligning arrow 402 in FIG. 4 with the warp direction of the textile. The printed circuit was then heat laminated to the textile by pressing it in a T-shirt press at 135° C. for approximately 5 seconds. After cooling, the textile was released from the frame.

Resistance Measurement v. Stretch

Resistance Measurement v. Stretch testing was performed as described in the test method set forth above. It was determined that the resistance of the circuit increased significantly as the flexible circuit was elongated to 50% strain.

Wash Testing

Wash testing durability was performed as described in the test method set forth above. The sample survived 1 wash cycle before 50% of the traces exceeded 1 Megaohm (MΩ) (Table 1).

MTVR

The moisture vapor transmission rate was measured as described in the test method set forth above. The MVTR was measured to be 19239 g/m²/24 hours (Table 1).

Kawabata Testing

Kawabata bending testing was performed as described in the test method set forth above. The Kawabata bend test value was measured as 0.0715 grams force-cm²/cm.

Example 13

A flexible circuit was prepared following the materials and processes of Example 8, except that the substrate was a 91 g/m² non-stretch, nylon woven material (Style 131859, (MI 270) from Milliken and Company, Spartanburg, S.C.).

Resistance Measurement v. Stretch

Resistance Measurement v. Stretch testing was performed as described in the test method set forth above. The resistance of the circuit increased significantly as the flexible circuit was elongated to 50% strain.

Wash Testing

Wash testing durability was performed as described in the test method set forth above. It was determined that the sample survived 1 wash cycle before 50% of the traces exceeded 1 Megaohm (MΩ) (Table 1).

MTVR

The moisture vapor transmission rate of the flexible circuit was measured as described in the test method set forth above. The MVTR was measured to be 1562 g/m²/24 hours (Table 1).

Kawabata Testing

Kawabata bending testing of the flexible circuit performed as described in the test method set forth above. The Kawabata bend test value was measured as 0.0807 grams force-cm²/cm.

Example 14

An ePTFE membrane made generally according to the teachings described in U.S. Pat. No. 3,953,566 having a mass per area of 19 g/m², a porosity of 56%, a thickness of 25 μm, a bubble point of 159 KPa, a matrix tensile strength of 48 MPa in the longitudinal direction, a matrix tensile strength of 97 MPa in the transverse direction was provided. The ePTFE membrane was dot printed with UT8 thermoplastic adhesive (Protechnic, Cernay France) using a 18Q236 gravure pattern.

Figure 8:
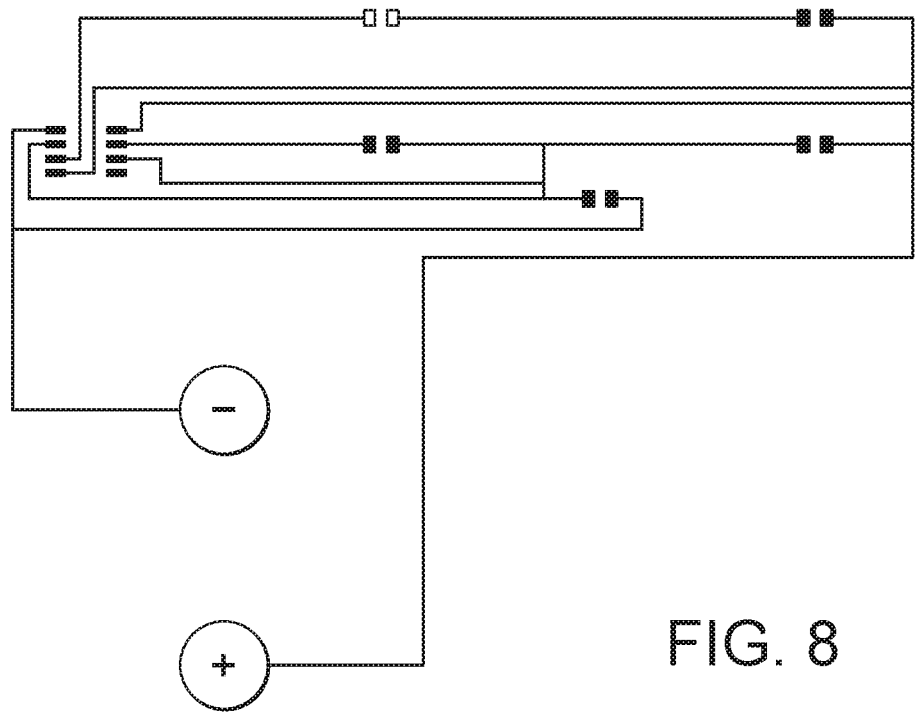
FIG. 8 is a schematic illustration of a conductive trace pattern according to at least one embodiment.
Figure 9:
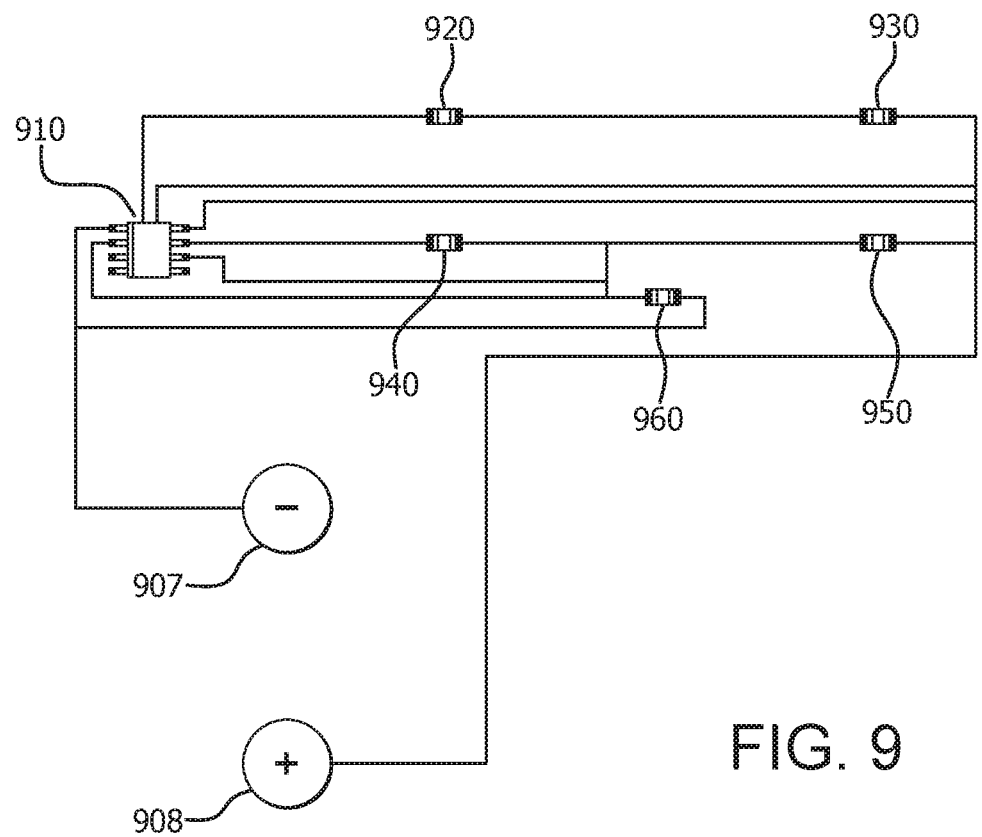
FIG. 9 is a schematic illustration of an electronic circuit that was created by adhering electronic components to the conductive ink trace of FIG. 8 according to at least one embodiment.

The adhesive printed ePTFE membrane was restrained in a 14 inch diameter embroidery hoop and screen printed onto the side without adhesive using conductive ink in the pattern shown in FIG. 8. The dimensions shown in FIG. 8 are in mm and shown to illustrate the size and shape of the pattern. The screen printing was performed using a model MSP-088 screen printer (HMI Manufacturing, Lebanon, N.J.) and a stainless steel screen with 200 TPI (threads/wire per inch; ~78.74 wires per cm), 1.6 mil (~40.64 μm) wire diameter, and a 12.7 μm emulsion. The conductive ink used was CI1036 (a highly conductive silver ink; total solids content 66%; Engineered Conductive Materials, Delaware, Ohio). The electrically conductive ink was dried in a convection oven at 160° C. for 10 minutes.

Surface mount electronic components were adhered to the electrically conductive trace on the ePTFE membrane to create a circuit. The electronic components were adhered using an electrically conductive ink CI1036 (Engineered Conductive Materials, Delaware, Ohio) as shown in FIG. 9 Electronic components included a 555 timer 910, an LED 920, a 470 Ohm resistor 930, a 20 k Ohm resistor 940, a 100 k Ohm resistor 950, and a 10 microfarad capacitor 960. The electrically conductive ink was dried in a convection oven at 130° C. for approximately 10 minutes.

The printed circuit was insulated by applying a solution of 3% pellethane in tetrahydrofuran (THF) using a cotton tipped applicator. The solution was coated on top of all the conductive ink and components, except the battery contacts 907, 908 in FIG. 9. The insulative coating was dried in a convection oven at 130° C. for approximately 10 minutes. The printed circuit was removed from the embroidery hoop by trimming the ePTFE around the perimeter of the conductive ink, leaving an approximate 5-10 mm border.

A nylon/polyester/elastane blend, twill weave, warp direction stretch textile (TD36B, Formosa Chemicals and Fibre Corporation, Taipei, Taiwan) was stretched in one direction to about 1.7 times its relaxed length and restrained in a rectangular frame. The printed circuit was positioned on the textile centered within the frame. The printed circuit was heat laminated to textile the by pressing it in a T shirt press at 135° C. for approximately 10-15 seconds. After cooling, the resulting conductive article was released from the frame and allowed to return to its relaxed state. It was noted that when 3.7 volts was applied to the terminals 907, 908 in FIG. 9, the LED would flash. Stretching and relaxing the conductive article did not affect the rate of flash or intensity of the LED.

TABLE 1

Summary of Results

| Example | Underlying Substrate | Lamination technique | Printing Substrate | Conductive Ink Position | Wash Testing (# of cycles for >50% to reach 1 MOhm) | Resistance vs. Stretch | Moisture Vapor Transmission Rate (g/m$^2$/24 hr) | Kawabata Bend Test (grams force-cm$^2$/cm) |
|---|---|---|---|---|---|---|---|---|
| 1 | Stretch Textile | Buckled | ePTFE Membrane1 | Imbibed | >20 | Negligible | 16114 | 0.0418 |
| 2 | Stretch Textile | Buckled | ePTFE Membrane 1 | Surface | 3 | Negligible | 16085 | 0.0364 |
| 3 | Stretch Textile | Buckled | ePTFE Membrane 2 | Surface | 3 | Negligible | 14263 | 0.0348 |
| 4 | Stretch Textile | Buckled | Urethane (nonporous) | Surface | 1 | Negligible | 2459 | 0.0527 |
| 5 | Stretch Textile | Buckled | Polyethylene | Surface | 3 | Negligible | 9721 | 0.0970 |
| 6 | Stretch Textile | Flat | ePTFE Membrane 1 | Imbibed | 6 | Significant | 17127 | 0.0669 |
| 7 | Stretch Textile | Flat | ePTFE Membrane 1 | Surface | 1 | Significant | 16259 | 0.0544 |
| 8 | Stretch Textile | Flat | Urethane (nonporous) | Surface | 1 | Significant | 1852 | 0.0710 |
| 9 | Urethane (nonporous) | Buckled | ePTFE Membrane 1 | Imbibed | N/A | Negligible | 7522 | 0.0356 |
| 10 | Urethane (nonporous) | Buckled | ePTFE membrane 1 | Surface | N/A | Negligible | 6972 | 0.0342 |
| 11 | Non-stretch textile | Flat | ePTFE Membrane 1 | Imbibed | 10 | Significant | 21119 | 0.0607 |
| 12 | Non-stretch textile | Flat | ePTFE Membrane 1 | Surface | 1 | Significant | 19239 | 0.0715 |
| 13 | Non-stretch textile | Flat | Urethane (nonporous) | Surface | 1 | Significant | 1562 | 0.0807 |

What is claimed is:

1. A conductive article having high flexibility and stretchability comprising:
 a printed circuit including:
  a synthetic polymer membrane compressed in a x-y direction;
  at least one electrically conductive trace, the at least one electrically conductive trace being located within the synthetic polymer membrane;
   wherein the at least one electrically conductive trace is imbibed into pores of the synthetic polymer membrane through a thickness thereof to form a continuous network of conductive particles within the synthetic polymer membrane; and
  a stretchable substrate bonded to the printed circuit, wherein the printed circuit has a buckled orientation in a z-direction.

2. The conductive article of claim 1, wherein the synthetic polymer membrane is a porous fluoropolymer membrane.

3. The conductive article of claim 1, wherein the synthetic polymer membrane is a microporous membrane having a node and fibril microstructure.

4. The conductive article of claim 1, wherein the synthetic polymer membrane is an expanded polytetrafluoroethylene membrane.

5. The conductive article of claim 1, wherein the synthetic polymer membrane is selected from expanded polytetrafluoroethylene (ePTFE), polyvinylidene fluoride (PVDF), fluorinated ethylene propylene (FEP), perfluoroalkoxy alkane (PFA), polyester sulfone (PES), porous poly paraxylylene (ePPX), porous ultra-high molecular weight polyethylene (eUHMWPE), porous ethylene tetrafluoroethylene (eETFE) and porous polylactic acid (ePLLA).

6. The conductive article of claim 1, wherein the stretchable substrate comprises at least one member selected from a stretchable textile, a stretchable nonwoven material and a stretchable membrane.

7. The conductive article of claim 1, wherein the at least one electrically conductive trace is selected from electrically conductive metal nanoparticles, nanoparticles of electrically conductive materials, electrically conductive particles, electrically conductive nanotubes, electrically conductive metal flakes, electrically conductive polymers and combinations thereof.

8. The conductive article of claim 1, wherein the at least one electrically conductive trace comprises nanoparticles of gold, silver, platinum, copper and combinations thereof.

9. The conductive article of claim 1, wherein the at least one electrically conductive trace has a form of an electrically conductive pattern or a circuit.

10. The conductive article of claim 1, comprising an insulative overcoat covering the at least one electrically conductive trace.

11. The conductive article of claim 1, wherein a resistance of the printed circuit remains substantially unchanged as the conductive article is elongated to 50% strain as evidenced by the Resistance Measurement v. Stretch test method.

12. The conductive article of claim 1, wherein the conductive article has a flexibility of less than 0.1 grams force-cm$^2$/cm as tested by the Kawabata test method.

13. An article comprising the conductive article of claim 1.

14. A conductive article having high flexibility and stretchability comprising:
 a printed circuit including:
  a synthetic polymer membrane compressed in a x-y direction;
  at least one electrically conductive trace, the at least one electrically conductive trace being located on the synthetic polymer membrane;
   wherein a portion of the at least one electrically conductive trace is imbibed within pores of the synthetic polymer membrane to form a continuous network of conductive particles within the synthetic polymer membrane; and
a stretchable substrate bonded to the printed circuit,
wherein the printed circuit has a buckled orientation in the z-direction.

15. The conductive article of claim 14, wherein the synthetic polymer membrane is a microporous synthetic polymer membrane.

16. The conductive article of claim 14, wherein the synthetic polymer membrane is selected from expanded polytetrafluoroethylene (ePTFE), porous poly paraxylylene (ePPX), porous ultra-high molecular weight polyethylene (eUHMWPE), porous ethylene tetrafluoroethylene (eETFE) and porous polylactic acid (ePLLA).

17. The conductive article of claim 14, wherein the synthetic polymer membrane is selected from polyurethane, polytetrafluoroethylene (PTFE), polyvinylidene fluoride (PVDF), fluorinated ethylene propylene (FEP), perfluoroalkoxy alkane (PFA), modified polytetrafluoroethylene polymers, tetrafluoroethylene (TFE) copolymers, polypropylene, polyethylene, polyvinylidene fluoride, polyester sulfone (PES), and polyesters.

18. The conductive article of claim 14, wherein the stretchable substrate comprises at least one member selected from a stretchable textile, a stretchable nonwoven material and a stretchable membrane.

19. The conductive article of claim 14, wherein the at least one electrically conductive trace is selected from electrically conductive metal nanoparticles, nanoparticles of electrically conductive materials, electrically conductive particles, electrically conductive nanotubes, electrically conductive metal flakes, electrically conductive polymers and combinations thereof.

20. The conductive article of claim 14, wherein the at least one electrically conductive trace comprises nanoparticles of, silver, gold, copper, platinum and combinations thereof.

21. The conductive article of claim 14, comprising an insulative overcoat covering the at least one electrically conductive trace.

22. The conductive article of claim 14, wherein the at least one electrically conductive trace has a form of an electrically conductive pattern or a circuit.

23. The conductive article of claim 14, wherein a resistance of the printed circuit remains substantially unchanged as the conductive article is elongated to 50% strain as evidenced by the Resistance Measurement v. Stretch test method.

24. The conductive article of claim 14, wherein the conductive article has a flexibility of less than 0.1 grams force-cm$^2$/cm as evidenced by the Kawabata test method.

25. The conductive article of claim 14, wherein the synthetic polymer membrane comprises polyurethane.

26. A conductive article comprising:
a printed circuit including:
an expanded polytetrafluoroethylene membrane compressed in a x-y direction;
at least one electrically conductive trace located within the expanded polytetrafluoroethylene membrane;
wherein the at least one electrically conductive trace is imbibed into pores of the expanded polytetrafluoroethylene membrane through a thickness thereof to form a continuous network of conductive particles within the synthetic polymer membrane; and
a stretchable textile bonded to said printed circuit,
wherein the expanded polytetrafluoroethylene membrane has a buckled orientation in a z-direction,
wherein a resistance of the printed circuit remains substantially unchanged as the conductive article is elongated to 50% strain, as determined by the Resistance Measurement v. Stretch test method,
wherein the conductive article has a flexibility of less than 0.1 grams force-cm$^2$/cm as determined by the Kawabata test method,
wherein the conductive article has a wash durability of at least 20 wash cycles as determined by the Wash Testing Durability test method, and
wherein the conductive article has a moisture vapor transmission rate of at least 5,000 as determined by the Moisture Vapor Transmission Rate (MVTR) Measurement test method.

27. A conductive article having high flexibility and stretchability comprising:
a first printed circuit including:
a synthetic polymer membrane compressed in a x-y direction;
at least one electrically conductive trace, the at least one electrically conductive trace being located within the synthetic polymer membrane;
wherein the at least one electrically conductive trace is imbibed into pores of the synthetic polymer membrane through a thickness thereof to form a continuous network of conductive particles within the synthetic polymer membrane;
a second printed circuit compressed in the x-y direction, and
a stretchable substrate, said first printed circuit being bonded to a first side of said stretchable substrate and said second printed circuit being bonded to a second side of said stretchable substrate,
wherein the first and second printed circuits have buckled orientations in a z-direction.

28. A conductive article having high flexibility and stretchability comprising:
a printed circuit including:
an expanded polytetrafluoroethylene membrane compressed in a x-y direction;
at least one electrically conductive trace located on a surface of the expanded polytetrafluoroethylene membrane;
wherein a portion of the at least one electrically conductive trace is imbibed within pores of the expanded polytetrafluoroethylene membrane to form a continuous network of conductive particles within the porous synthetic polymer membrane; and
a stretchable textile bonded to said printed circuit,
wherein the expanded polytetrafluoroethylene membrane has a buckled orientation in a z-direction,
wherein a resistance of the printed circuit remains substantially unchanged as the conductive article is elongated to 50% strain as determined by the Resistance Measurement v. Stretch test method,
wherein the conductive article has a flexibility of less than 0.1 grams force-cm$^2$/cm as determined by the Kawabata test method, and
wherein the conductive article has a moisture vapor transmission rate of at least 5,000 as determined by the Moisture Vapor Transmission Rate (MVTR) Measurement test method.

* * * * *